United States Patent
Peng et al.

(10) Patent No.: US 12,444,608 B2
(45) Date of Patent: Oct. 14, 2025

(54) STRUCTURE HAVING GATE SPACERS WITH PROJECTING PORTIONS EXTENDING INTO A GATE DIELECTRIC

(71) Applicant: Taiwan Semiconductor Manufacturing Co., Ltd., Hsinchu (TW)

(72) Inventors: Yu-Jiun Peng, Hsinchu (TW); Hsiu-Hao Tsao, Taichung (TW); Shu-Han Chen, Hsinchu (TW); Chang-Jhih Syu, Hsinchu (TW); Kuo-Feng Yu, Zhudong Township (TW); Jian-Hao Chen, Hsinchu (TW); Chih-Hao Yu, Tainan (TW); Chang-Yun Chang, Taipei (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 187 days.

(21) Appl. No.: 17/863,006

(22) Filed: Jul. 12, 2022

(65) Prior Publication Data
US 2022/0351975 A1 Nov. 3, 2022

Related U.S. Application Data

(62) Division of application No. 16/787,229, filed on Feb. 11, 2020, now Pat. No. 11,398,384.

(51) Int. Cl.
*H10D 30/01* (2025.01)
*H01L 21/02* (2006.01)
(Continued)

(52) U.S. Cl.
CPC .. *H01L 21/28132* (2013.01); *H01L 21/02326* (2013.01); *H01L 21/28114* (2013.01);
(Continued)

(58) Field of Classification Search
CPC ..... H01L 21/823431; H01L 21/823821; H01L 21/845; H01L 27/0886; H01L 27/0924;
(Continued)

(56) References Cited

U.S. PATENT DOCUMENTS 8,487,378 B2  7/2013 Goto et al.
8,729,634 B2  5/2014 Shen et al.
(Continued)

FOREIGN PATENT DOCUMENTS

CN  101656205 A  2/2010
CN  102104003 A  6/2011
(Continued)

*Primary Examiner* — Younes Boulghassoul
(74) *Attorney, Agent, or Firm* — Slater Matsil, LLP

(57) ABSTRACT

In an embodiment, a structure includes: a semiconductor substrate; a gate spacer over the semiconductor substrate, the gate spacer having an upper portion and a lower portion, a first width of the upper portion decreasing continually in a first direction extending away from a top surface of the semiconductor substrate, a second width of the lower portion being constant along the first direction; a gate stack extending along a first sidewall of the gate spacer and the top surface of the semiconductor substrate; and an epitaxial source/drain region adjacent a second sidewall of the gate spacer.

20 Claims, 19 Drawing Sheets

(51) Int. Cl.
*H01L 21/28* (2006.01)
*H01L 21/285* (2006.01)
*H01L 21/311* (2006.01)
*H01L 21/3115* (2006.01)
*H10D 30/62* (2025.01)
*H10D 30/69* (2025.01)
*H10D 62/13* (2025.01)
*H10D 64/01* (2025.01)
*H10D 64/27* (2025.01)
*H10D 64/62* (2025.01)
*H10D 64/66* (2025.01)
*H10D 84/01* (2025.01)
*H10D 84/03* (2025.01)

(52) U.S. Cl.
CPC .. *H01L 21/28518* (2013.01); *H01L 21/31116* (2013.01); *H01L 21/31155* (2013.01); *H10D 30/024* (2025.01); *H10D 30/62* (2025.01); *H10D 30/6211* (2025.01); *H10D 30/797* (2025.01); *H10D 62/151* (2025.01); *H10D 64/015* (2025.01); *H10D 64/017* (2025.01); *H10D 64/518* (2025.01); *H10D 64/62* (2025.01); *H10D 64/671* (2025.01); *H10D 84/0135* (2025.01); *H10D 84/0147* (2025.01); *H10D 84/0172* (2025.01); *H10D 84/0184* (2025.01); *H10D 84/038* (2025.01)

(58) Field of Classification Search
CPC ........... H01L 27/1211; H01L 27/10826; H01L 27/10879; H01L 29/41791; H01L 29/66795–66818; H01L 29/785–7856; H01L 2029/7857–7858; H01L 2924/13067; H01L 29/78696; H01L 29/42392; H01L 29/0673; H01L 29/66439; H01L 29/775; H01L 21/823468; H01L 21/823864; H01L 29/6656; H01L 29/6653; H01L 29/66553; H01L 29/42376; H01L 29/42384; H01L 21/28114; H01L 21/823437; H01L 21/823828; H01L 21/823456; H01L 21/82385; H01L 21/28123–2815; H10D 84/0158; H10D 84/0193; H10D 84/834; H10D 84/853; H10D 86/011; H10D 86/215; H10D 30/024–0245; H10D 30/62–6219; H10D 30/43–435; H10D 30/6757; H10D 30/6735; H10D 30/501–509; H10D 30/014; H10D 30/019–0198; H10D 62/119–123; H10D 84/851; H10D 84/852; H10D 84/832; H10D 84/833; H10D 84/0135; H10D 84/014; H10D 84/0142; H10D 84/0172; H10D 84/0177; H10D 84/0179; H10D 64/017; H10D 64/517; H10D 64/518; H10D 30/673; H10D 84/0147; H10D 84/0184; H10D 64/021; H10D 64/015; H10D 64/018; H10D 64/675; H10B 12/36; H10B 12/056
See application file for complete search history.

(56) References Cited

U.S. PATENT DOCUMENTS

| | | | |
|---|---|---|---|
| 8,826,213 B1 | 9/2014 | Ho et al. | |
| 8,887,106 B2 | 11/2014 | Ho et al. | |
| 9,287,403 B1* | 3/2016 | Lee | H01L 29/6656 |
| 9,299,939 B1 | 3/2016 | Cao et al. | |
| 9,660,028 B1 | 5/2017 | Cheng et al. | |
| 9,660,050 B1* | 5/2017 | Cai | H01L 29/66545 |
| 10,043,879 B1 | 8/2018 | Kim et al. | |
| 2002/0142523 A1 | 10/2002 | Ryu et al. | |
| 2005/0272231 A1 | 12/2005 | Yun et al. | |
| 2006/0063318 A1 | 3/2006 | Datta et al. | |
| 2010/0044783 A1* | 2/2010 | Chuang | H01L 21/28114 438/589 |
| 2011/0073963 A1 | 3/2011 | Beyer et al. | |
| 2011/0079854 A1 | 4/2011 | Lin | |
| 2011/0151655 A1 | 6/2011 | Chan et al. | |
| 2012/0088359 A1 | 4/2012 | Kim et al. | |
| 2012/0322218 A1 | 12/2012 | Lai et al. | |
| 2013/0020655 A1* | 1/2013 | Mieno | H01L 29/4983 438/300 |
| 2014/0080276 A1 | 3/2014 | Brand et al. | |
| 2014/0124874 A1* | 5/2014 | Mehrotra | H10D 64/667 257/E21.409 |
| 2014/0231885 A1* | 8/2014 | Xie | H01L 29/6656 438/585 |
| 2014/0282326 A1 | 9/2014 | Chen et al. | |
| 2015/0041905 A1* | 2/2015 | Xie | H01L 29/517 257/369 |
| 2015/0069516 A1* | 3/2015 | Lenox | H10D 84/0172 257/369 |
| 2015/0255542 A1 | 9/2015 | Cai et al. | |
| 2016/0049488 A1 | 2/2016 | Shen et al. | |
| 2016/0181384 A1* | 6/2016 | Liu | H01L 29/66772 438/270 |
| 2016/0240624 A1* | 8/2016 | Zhu | H01L 29/66568 |
| 2016/0343827 A1 | 11/2016 | Wu et al. | |
| 2016/0365449 A1 | 12/2016 | Chang et al. | |
| 2017/0005005 A1 | 1/2017 | Chen et al. | |
| 2017/0033105 A1 | 2/2017 | Wang | |
| 2017/0186623 A1 | 6/2017 | Posseme et al. | |
| 2017/0213828 A1* | 7/2017 | Chang | H01L 29/7851 |
| 2018/0069103 A1 | 3/2018 | Chui et al. | |
| 2018/0122920 A1 | 5/2018 | Chan et al. | |
| 2018/0151373 A1* | 5/2018 | Tsai | H10D 30/024 |
| 2018/0151699 A1 | 5/2018 | Lu et al. | |
| 2018/0174846 A1* | 6/2018 | Wang | H01L 29/0847 |
| 2018/0182856 A1 | 6/2018 | Lee | |
| 2019/0013400 A1 | 1/2019 | Lee et al. | |
| 2019/0051730 A1 | 2/2019 | Min | |
| 2019/0148557 A1 | 5/2019 | Cai et al. | |
| 2020/0135474 A1 | 4/2020 | Chen et al. | |
| 2020/0251573 A1* | 8/2020 | Jeong | H10D 64/01 |
| 2020/0343362 A1* | 10/2020 | Wu | H01L 29/6653 |
| 2021/0035857 A1 | 2/2021 | Zhou | |
| 2021/0074829 A1* | 3/2021 | Tang | H01L 21/31155 |
| 2021/0202749 A1 | 7/2021 | Zhang et al. | |
| 2021/0210637 A1 | 7/2021 | Zhang et al. | |
| 2021/0233997 A1 | 7/2021 | Chen et al. | |

FOREIGN PATENT DOCUMENTS

| | | |
|---|---|---|
| CN | 107799422 A | 3/2018 |
| CN | 110571141 A | 12/2019 |
| KR | 100355035 B1 | 10/2002 |
| KR | 20030033672 A | 5/2003 |
| KR | 20050116707 A | 12/2005 |
| KR | 20170004827 A | 1/2017 |
| KR | 20180027335 A | 3/2018 |
| KR | 20180073223 A | 7/2018 |
| KR | 20180103402 A | 9/2018 |
| KR | 20180118027 A | 10/2018 |
| TW | 201123276 A | 7/2011 |
| TW | 201824447 A | 7/2018 |

* cited by examiner

STRUCTURE HAVING GATE SPACERS WITH PROJECTING PORTIONS EXTENDING INTO A GATE DIELECTRIC

PRIORITY CLAIM AND CROSS-REFERENCE

This application is a divisional of U.S. application Ser. No. 16/787,229, filed on Feb. 11, 2020, entitled "Semiconductor Device and Method," which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
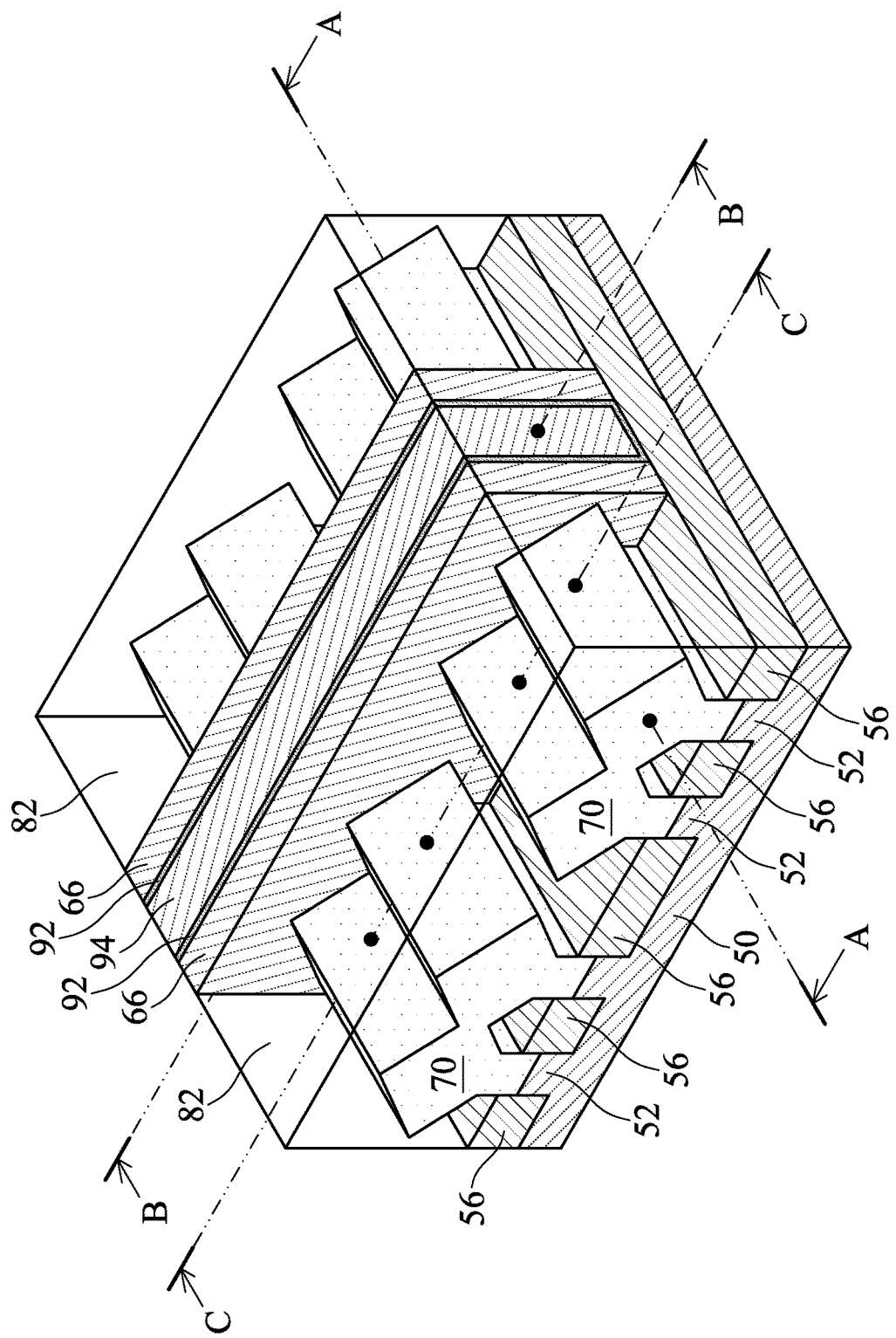
FIG. 1 illustrates an example of a FinFET in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, funnel-shaped gate electrodes are formed in a replacement gate process for FinFETs. During a replacement gate process, the recesses for the replacement gates can be widened to have funnel shapes. The recesses can be widened by implanting an impurity in upper regions of the gate spacers for the FinFETs, and then removing the upper regions of the gate spacers with an etch that is selective to the impurity. Widening the recesses to have funnel shapes can help avoid the formation of seams (or voids) when filling the replacement gates.

FIG. 1 illustrates an example of simplified Fin Field-Effect Transistors (FinFETs) in a three-dimensional view, in accordance with some embodiments. Some other features of the FinFETs (discussed below) are omitted for illustration clarity. The illustrated FinFETs may be electrically connected or coupled in a manner to operate as, for example, one transistor or multiple transistors, such as two transistors.

The FinFETs comprise fins 52 extending from a substrate 50. Shallow trench isolation (STI) regions 56 are disposed over the substrate 50, and the fins 52 protrude above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fins 52 are illustrated as being a single, continuous material of the substrate 50, the fins 52 and/or the substrate 50 may comprise a single material or a plurality of materials. In this context, the fins 52 refer to the portions extending between the neighboring STI regions 56.

Gate dielectrics 92 are along sidewalls and over top surfaces of the fins 52, and gate electrodes 94 are over the gate dielectrics 92. Source/drain regions 70 are disposed in opposite sides of the fin 52 with respect to the gate dielectrics 92 and gate electrodes 94. Gate spacers 66 separate the source/drain regions 70 from the gate dielectrics 92 and gate electrodes 94. An inter-layer dielectric (ILD) layer 82 is disposed over the source/drain regions 70 and STI regions 56. In embodiments where multiple transistors are formed, the source/drain regions 70 may be shared between various transistors. In embodiments where one transistor is formed from multiple fins 52, neighboring source/drain regions 70 may be electrically connected, such as through coalescing the source/drain regions 70 by epitaxial growth, or through coupling the source/drain regions 70 with a same source/drain contact.

FIG. 1 further illustrates several reference cross-sections. Cross-section A-A is along a longitudinal axis of the fin 52 and in a direction of, for example, a current flow between the source/drain regions 70 of the FinFETs. Cross-section B-B is perpendicular to cross-section A-A and is along a longitudinal axis of the gate electrode 94 and in a direction, for example, perpendicular to the direction of current flow between the source/drain regions 70 of the FinFETs. Cross-section C-C is parallel to cross-section B-B and extends through the source/drain regions 70 of the FinFETs. Subsequent figures refer to these reference cross-sections for clarity.

Figure 2:
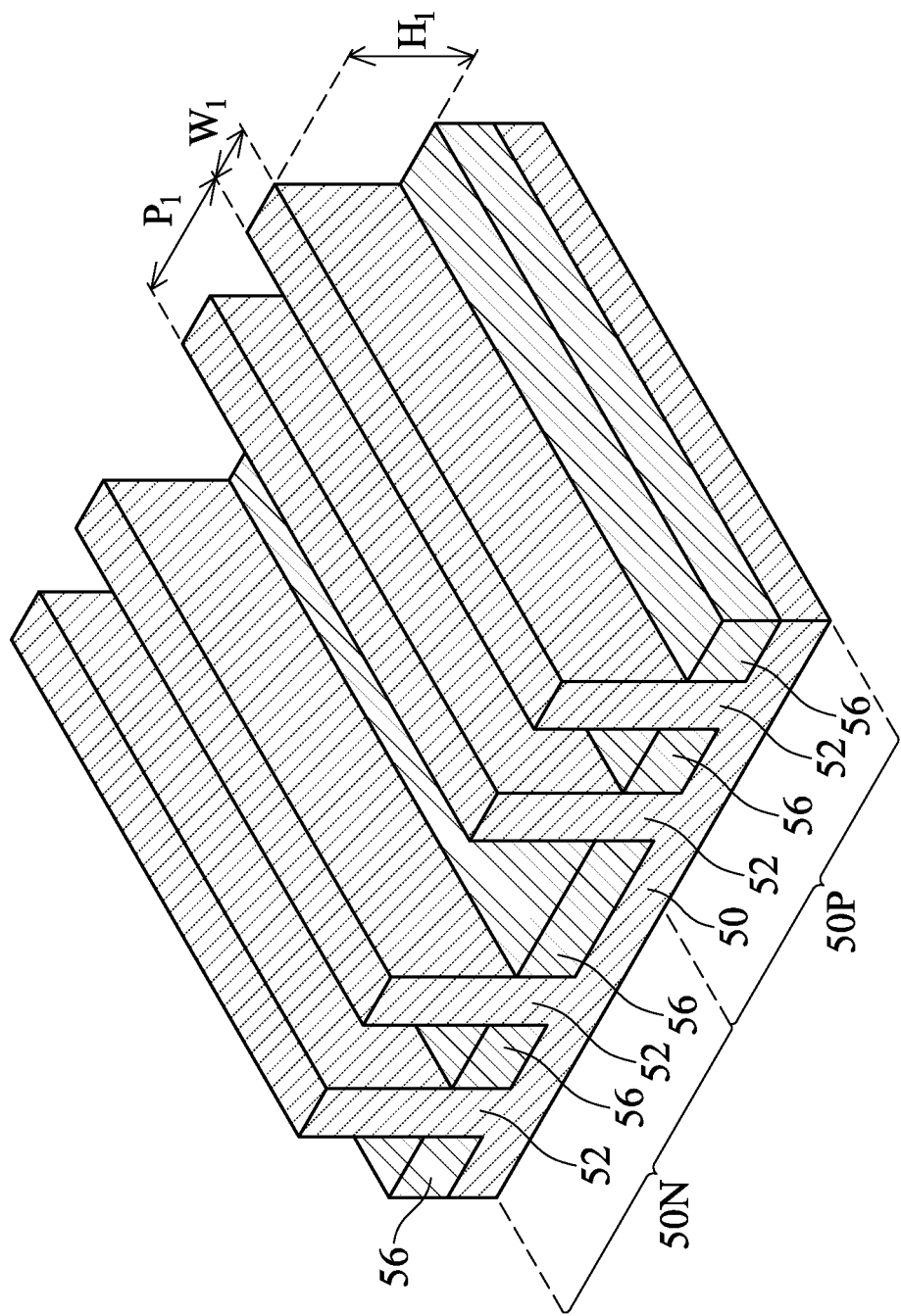
FIGS. 2, 3, 4A, 4B, 4C, 4D, 5A, 5B, 6A, 6B, 7A, and 7B are various views of intermediate stages in the manufacturing of FinFETs, in accordance with some embodiments.
Figure 3:
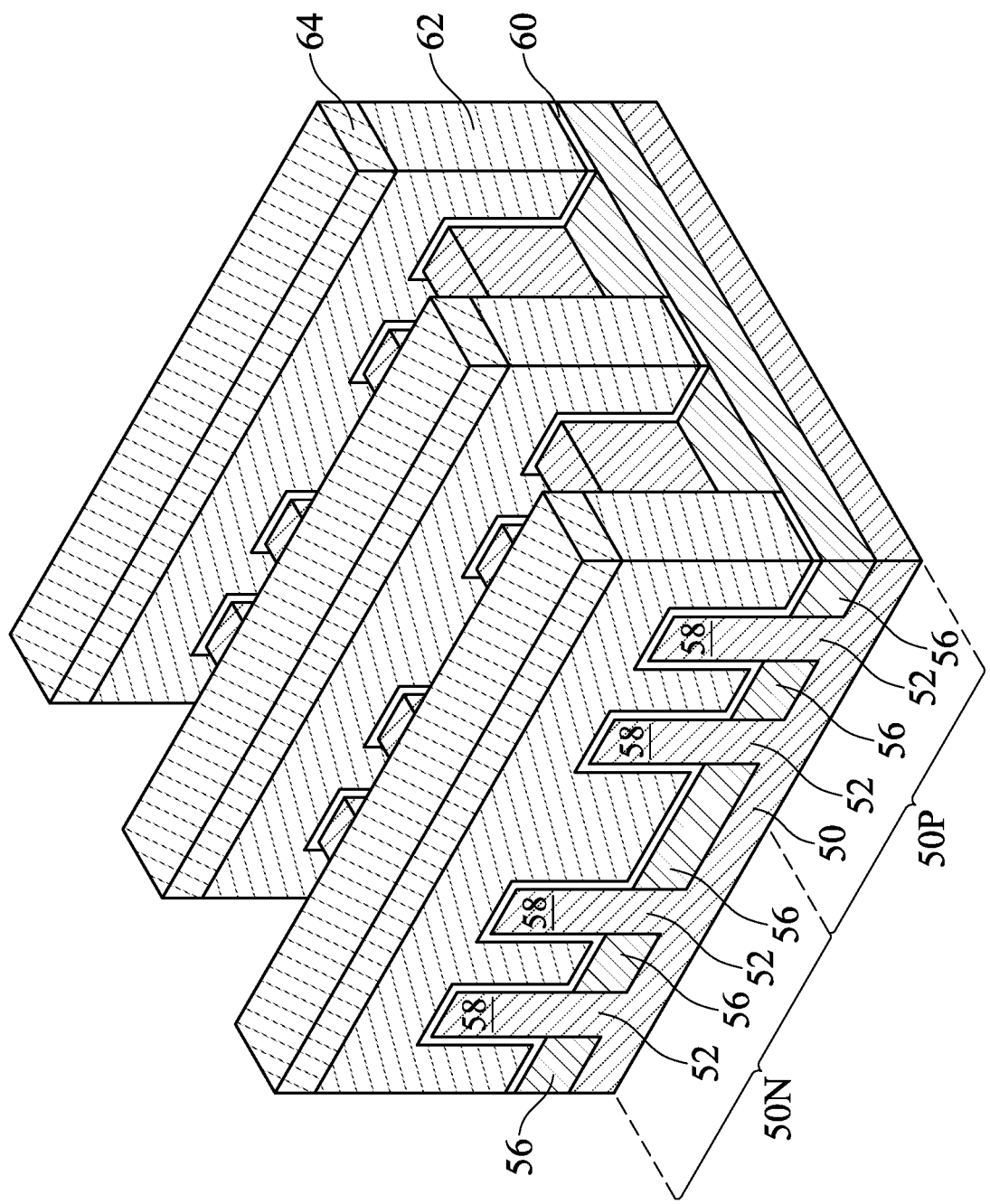

FIGS. 2 through 11B are various views of intermediate stages in the manufacturing of FinFETs, in accordance with some embodiments. FIGS. 2 and 3 are three-dimensional views. FIGS. 4A, 5A, 6A, 7A, 9A, 10A, and 11A are cross-sectional views illustrated along reference cross-section A-A in FIG. 1, except three gate structures are shown. FIGS. 4B, 5B, 6B, 7B, 9B, 10B, and 11B are cross-sectional views illustrated along reference cross-section B-B in FIG. 1, except only two fins 52 are shown. FIGS. 4C and 4D are cross-sectional views illustrated along reference cross-section C-C in FIG. 1, except only two fins 52 are shown.

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

The substrate 50 has a region 50N and a region 50P. The region 50N can be for forming n-type devices, such as NMOS transistors, e.g., n-type FinFETs. The region 50P can be for forming p-type devices, such as PMOS transistors, e.g., p-type FinFETs. The region 50N may be physically separated from the region 50P, and any number of device features (e.g., other active devices, doped regions, isolation structures, etc.) may be disposed between the region 50N and the region 50P.

Fins 52 are formed extending from the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), the like, or a combination thereof. The etch may be anisotropic. After formations, the fins 52 have a width $W_1$, and fins 52 in a same region 50N/50P are spaced apart by a pitch $P_1$. The width $W_1$ can be in the range of about 3 nm to about 30 nm. The pitch $P_1$ can be in the range of about 20 nm to about 100 nm.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

STI regions 56 are formed over the substrate 50 and between neighboring fins 52. As an example to form the STI regions 56, an insulation material is formed over the intermediate structure. The insulation material may be an oxide, such as silicon oxide, a nitride, the like, or a combination thereof, and may be formed by a high density plasma chemical vapor deposition (HDP-CVD), a flowable chemical vapor deposition (FCVD) (e.g., a chemical vapor deposition (CVD) based material deposition in a remote plasma system and post curing to make it convert to another material, such as an oxide), the like, or a combination thereof. Other insulation materials formed by any acceptable process may be used. In the illustrated embodiment, the insulation material is silicon oxide formed by a FCVD process. An anneal process may be performed once the insulation material is formed. In an embodiment, the insulation material is formed such that excess insulation material covers the fins 52. Some embodiments may utilize multiple layers. For example, in some embodiments a liner (not shown) may first be formed along a surface of the substrate 50 and the fins 52. Thereafter, a fill material, such as those discussed above may be formed over the liner. A removal process is applied to the insulation material to remove excess insulation material over the fins 52. In some embodiments, a planarization process such as a chemical mechanical polish (CMP), an etch back process, combinations thereof, or the like may be utilized. The planarization process exposes the fins 52 such that top surfaces of the fins 52 and the insulation material are level after the planarization process is complete. The insulation material is then recessed, with remaining portions of the insulation material forming the STI regions 56. The insulation material is recessed such that upper portions of fins 52 in the region 50N and in the region 50P protrude from between neighboring STI regions 56. After the recessing, exposed portions of the fins 52 extend a height $H_1$ above top surfaces of the STI regions 56. The height $H_1$ can be greater than about 40 nm, such as in the range of about 50 nm to about 80 nm. The exposed portions of the fins 52 include what will be channel regions of the resulting FinFETs.

Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material (e.g., etches the material of the insulation material at a faster rate than the material of the fins 52). For example, a chemical oxide removal with a suitable etch process using, for example, dilute hydrofluoric (dHF) acid may be used.

The process described above is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins 52. For example, after the insulation material of the STI regions 56 is planarized with the fins 52, the fins 52 can be recessed, and a material different from the fins 52 may be epitaxially grown over the recessed fins 52. In such embodiments, the fins 52 comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins 52. In some embodiments where homoepitaxial or heteroepitaxial structures are epitaxially grown, the epitaxially grown materials may be in situ doped during growth, which may obviate prior and subsequent implantations although in situ and implantation doping may be used together.

Still further, it may be advantageous to epitaxially grow a material in region 50N (e.g., an NMOS region) different from the material in region 50P (e.g., a PMOS region). In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further, appropriate wells (not shown) may be formed in the fins 52 and/or the substrate 50. In some embodiments, a P well may be formed in the region 50N, and an N well may be formed in the region 50P. In some embodiments, a P well or an N well are formed in both the region 50N and the region 50P.

In the embodiments with different well types, the different implant steps for the region 50N and the region 50P may be achieved using a photoresist or other masks (not shown). For example, a photoresist may be formed over the fins 52 and the STI regions 56 in the region 50N. The photoresist is patterned to expose the region 50P of the substrate 50, such as a PMOS region. The photoresist can be formed by using a spin-on technique and can be patterned using acceptable photolithography techniques. Once the photoresist is patterned, an n-type impurity implant is performed in the region 50P, and the photoresist may act as a mask to substantially prevent n-type impurities from being implanted into the region 50N, such as an NMOS region. The n-type impurities may be phosphorus, arsenic, antimony, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist is removed, such as by an acceptable ashing process.

Following the implanting of the region 50P, a photoresist is formed over the fins 52 and the STI regions 56 in the region 50P. The photoresist is patterned to expose the region 50N of the substrate 50, such as the NMOS region. The photoresist can be formed by using a spin-on technique and can be patterned using acceptable photolithography techniques. Once the photoresist is patterned, a p-type impurity implant may be performed in the region 50N, and the photoresist may act as a mask to substantially prevent p-type impurities from being implanted into the region 50P, such as the PMOS region. The p-type impurities may be boron, $BF_2$, indium, or the like implanted in the region to a concentration of equal to or less than $10^{18}$ $cm^{-3}$, such as between about $10^{17}$ $cm^{-3}$ and about $10^{18}$ $cm^{-3}$. After the implant, the photoresist may be removed, such as by an acceptable ashing process.

After the implants of the region 50N and the region 50P, an anneal may be performed to activate the p-type and/or n-type impurities that were implanted. In some embodiments, the grown materials of epitaxial fins may be in situ doped during growth, which may obviate the implantations, although in situ and implantation doping may be used together.

In FIG. 3, dummy gate dielectrics 60 are formed over the fins 52 and dummy gate electrodes 62 are formed over the dummy gate dielectrics 60. The dummy gate dielectrics 60 and dummy gate electrodes 62 may be collectively referred to as dummy gate stacks. The dummy gate stacks extend along sidewalls and top surfaces of the fins 52.

As an example of forming the dummy gate dielectrics 60 and dummy gate electrodes 62, a dummy dielectric layer is formed on the fins 52. The dummy dielectric layer may be, for example, silicon oxide, silicon nitride, a combination thereof, or the like, and may be deposited or thermally grown according to acceptable techniques. A dummy gate layer is formed over the dummy dielectric layer, and a mask layer is formed over the dummy gate layer. The dummy gate layer may be deposited over the dummy dielectric layer and then planarized, such as by a CMP. The mask layer may be deposited over the dummy gate layer. The dummy gate layer may be a conductive or non-conductive material and may be selected from a group including amorphous silicon, polycrystalline-silicon (polysilicon), poly-crystalline silicon germanium (poly-SiGe), metallic nitrides, metallic silicides, metallic oxides, and metals. The dummy gate layer may be deposited by physical vapor deposition (PVD), CVD, sputter deposition, or other techniques known and used in the art for depositing conductive materials. The dummy gate layer may be made of other materials that have a high etching selectivity from the etching of STI regions 56. The mask layer may include, for example, silicon nitride, silicon oxynitride, or the like. In this example, a single dummy gate layer and a single mask layer are formed across the region 50N and the region 50P. In some embodiments, the dummy dielectric layer may be deposited such that the dummy dielectric layer covers the STI regions 56, extending between the dummy gate layer and the STI regions 56. The mask layer is then patterned using acceptable photolithography and etching techniques to form masks 64. The pattern of the masks 64 is then transferred to the dummy gate layer by an acceptable etching technique to form the dummy gate electrodes 62. The pattern of the masks 64 is further transferred to the dummy dielectric layer to form the dummy gate dielectrics 60. The dummy gate electrodes 62 cover respective channel regions 58 of the fins 52. The dummy gate electrodes 62 may also have a lengthwise direction substantially perpendicular (within process limitations) to the lengthwise direction of respective fins 52.

Figure 4B:
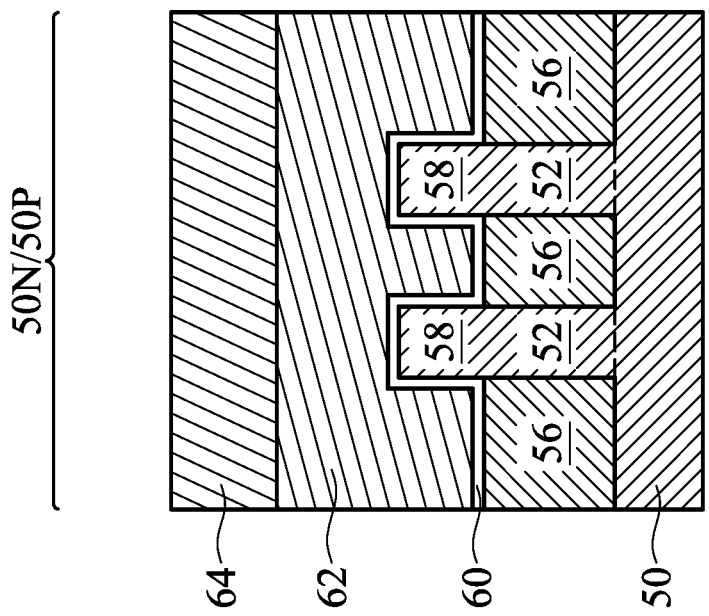
Figure 4A:
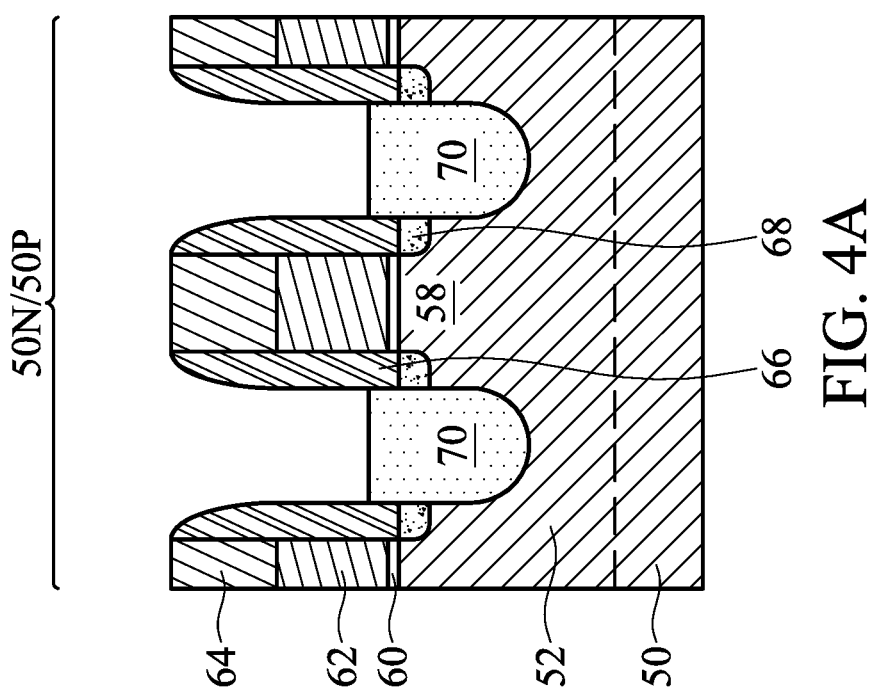

In FIGS. 4A and 4B, gate spacers 66 are formed on exposed surfaces of the dummy gate electrodes 62, the masks 64, and/or the fins 52. The gate spacers 66 may be formed by conformally depositing an insulating material and subsequently etching the insulating material. The insulating material of the gate spacers 66 may be silicon nitride, silicon carbonitride, silicon oxycarbonitride, a combination thereof, or the like, and may be formed by a conformal deposition process such as chemical vapor deposition (CVD), plasma enhanced chemical vapor deposition (PECVD), atomic layer deposition (ALD), or the like. Once formed, the insulating material can be etched by, e.g., a wet etch to form the gate spacers 66. The etching of the gate spacers 66 can be anisotropic. After etching, the gate spacers 66 can have curved sidewalls (as illustrated) or can have straight sidewalls (not illustrated).

In some embodiments, the gate spacers 66 are formed of one or more silicon oxycarbonitride layer(s), such as two silicon oxycarbonitride layers. In some embodiments, each silicon oxycarbonitride layer has a composition of about 34 percent by mass silicon, 36 percent by mass oxygen, 8 percent by mass carbon, and 21 percent by mass nitrogen. The silicon oxycarbonitride layer(s) can be deposited using dielectric material precursors comprising a silicon source precursor (e.g., hexachlorodisilane ($Si_2Cl_6$, HCD)), an oxygen source precursor (e.g., oxygen gas ($O_2$)), a carbon source precursor (e.g., propylene ($C_3H_6$)), and a nitrogen source precursor (e.g., ammonia ($NH_3$)). In embodiments where the deposition is by CVD, the composition(s) of the silicon oxycarbonitride layer(s) can be controlled by controlling the flow rates of the source precursors during CVD. For example, the silicon source precursor can be dispensed at a rate in the range of about 100 sccm to about 1000 sccm, the oxygen source precursor can be dispensed at a rate in the range of about 1000 sccm to about 20000 sccm, the carbon source precursor can be dispensed at a rate in the range of about 1000 sccm to about 10000 sccm, and the nitrogen source precursor can be dispensed at a rate in the range of about 5000 sccm to about 30000 sccm. Once formed, the silicon oxycarbonitride layer(s) can be etched as discussed above to form the gate spacers 66.

Before or during the formation of the gate spacers 66, implants for lightly doped source/drain (LDD) regions 68 may be performed. In the embodiments with different device types, similar to the implants discussed, a mask, such as a photoresist, may be formed over the region 50N, while exposing the region 50P, and appropriate type (e.g., p-type) impurities may be implanted into the exposed fins 52 in the region 50P. The mask may then be removed. Subsequently, a mask, such as a photoresist, may be formed over the region 50P while exposing the region 50N, and appropriate type impurities (e.g., n-type) may be implanted into the exposed fins 52 in the region 50N. The mask may then be removed. The n-type impurities may be any of the n-type impurities previously discussed, and the p-type impurities may be any of the p-type impurities previously discussed. The lightly doped source/drain regions may have a concentration of impurities in the range of about $10^{15}$ $cm^{-3}$ to about $10^{16}$ $cm^{-3}$. An anneal may be used to activate the implanted impurities.

Epitaxial source/drain regions 70 are then formed in the fins 52 to exert stress in the respective channel regions 58, thereby improving performance. The epitaxial source/drain regions 70 are formed in the fins 52 such that each dummy gate electrode 62 is disposed between respective neighboring pairs of the epitaxial source/drain regions 70. The epitaxial source/drain regions 70 extend into, and may also penetrate through, the LDD regions 68. In some embodiments, the gate spacers 66 are used to offset the epitaxial source/drain regions 70 from the dummy gate electrodes 62 by an appropriate lateral distance so that the epitaxial source/drain regions 70 do not short out subsequently formed gates of the resulting FinFETs.

The epitaxial source/drain regions 70 in the region 50N, e.g., the NMOS region, may be formed by masking the region 50P, e.g., the PMOS region, and etching source/drain regions of the fins 52 in the region 50N to form recesses in the fins 52. Then, the epitaxial source/drain regions 70 in the region 50N are epitaxially grown in the recesses. The epitaxial source/drain regions 70 may include any acceptable material, such as appropriate for n-type FinFETs. For example, if the fin 52 is silicon, the epitaxial source/drain regions 70 in the region 50N may include materials exerting a tensile strain in the channel region 58, such as silicon, silicon carbide, phosphorous doped silicon carbide, silicon phosphide, or the like. The epitaxial source/drain regions 70 in the region 50N may have surfaces raised from respective surfaces of the fins 52 and may have facets.

The epitaxial source/drain regions 70 in the region 50P, e.g., the PMOS region, may be formed by masking the region 50N, e.g., the NMOS region, and etching source/drain regions of the fins 52 in the region 50P to form recesses in the fins 52. Then, the epitaxial source/drain regions 70 in the region 50P are epitaxially grown in the recesses. The epitaxial source/drain regions 70 may include any acceptable material, such as appropriate for p-type FinFETs. For example, if the fin 52 is silicon, the epitaxial source/drain regions 70 in the region 50P may comprise materials exerting a compressive strain in the channel region 58, such as silicon-germanium, boron doped silicon-germanium, germanium, germanium tin, or the like. The epitaxial source/drain regions 70 in the region 50P may also have surfaces raised from respective surfaces of the fins 52 and may have facets.

The epitaxial source/drain regions 70 and/or the fins 52 may be implanted with dopants to form source/drain regions, similar to the process previously discussed for forming lightly-doped source/drain regions, followed by an anneal. The source/drain regions may have an impurity concentration of between about $10^{19}$ $cm^{-3}$ and about $10^{21}$ $cm^{-3}$. The n-type and/or p-type impurities for source/drain regions may be any of the impurities previously discussed. In some embodiments, the epitaxial source/drain regions 70 may be in situ doped during growth.

Figure 4C:
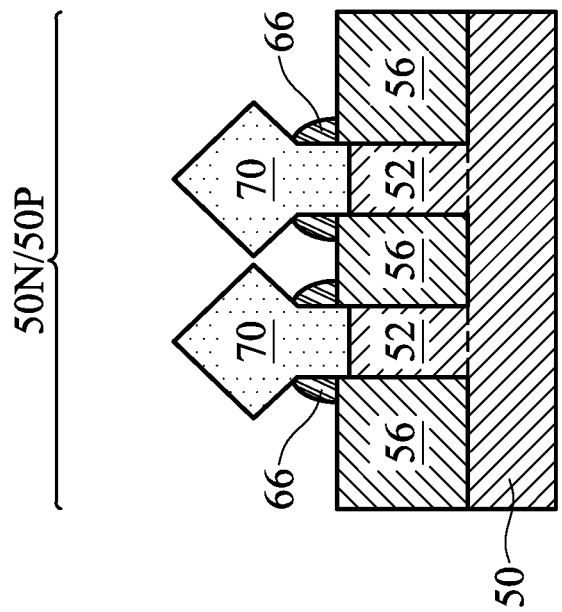
Figure 4D:
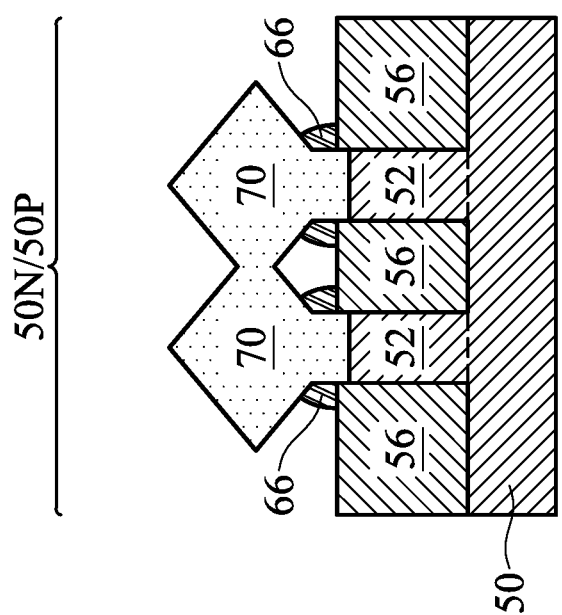

As a result of the epitaxy processes used to form the epitaxial source/drain regions 70 in the region 50N and the region 50P, upper surfaces of the epitaxial source/drain regions have facets which expand laterally outward beyond sidewalls of the fins 52. In some embodiments, these facets cause adjacent epitaxial source/drain regions 70 of a same FinFET to merge as illustrated by FIG. 4C. In other embodiments, adjacent epitaxial source/drain regions 70 remain separated after the epitaxy process is completed as illustrated by FIG. 4D. In the embodiments illustrated in FIGS. 4C and 4D, the gate spacers 66 are formed covering a portion of the sidewalls of the fins 52 that extend above the STI regions 56 thereby blocking the epitaxial growth. In some other embodiments, the etch used to form the gate spacers 66 may be adjusted to remove the spacer material to allow the epitaxially grown region to extend to the surface of the STI region 56.

Figure 5B:
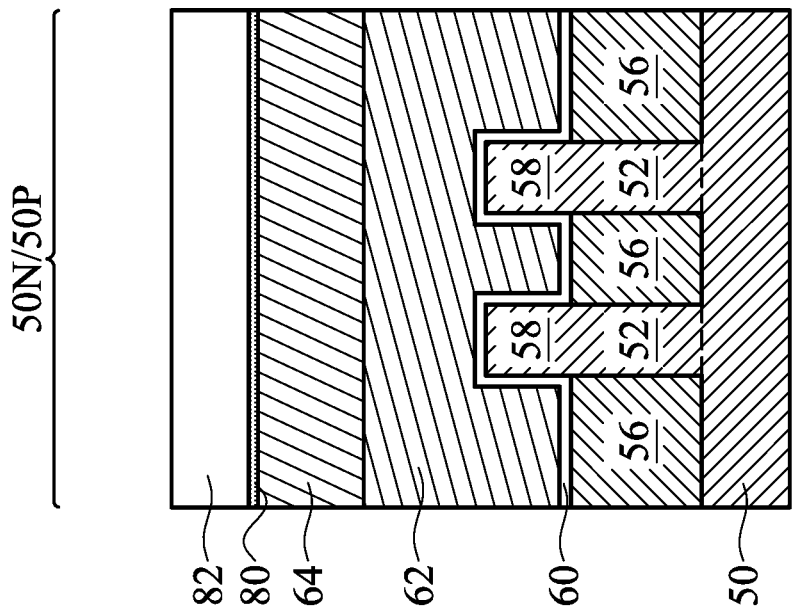
Figure 5A:
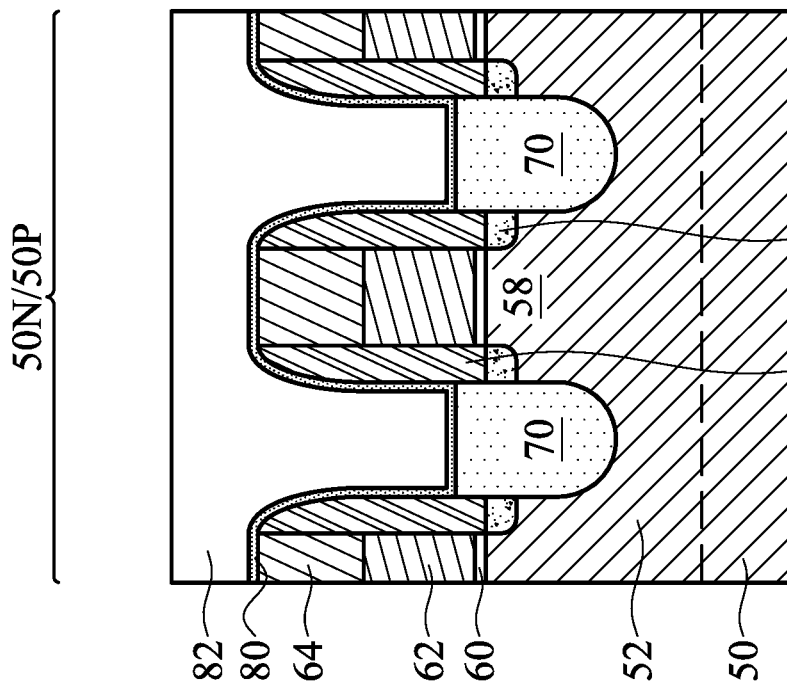

In FIGS. 5A and 5B, a first ILD layer 82 is deposited over the intermediate structure. The first ILD layer 82 may be formed of a dielectric material, and may be deposited by any suitable method, such as CVD, plasma-enhanced CVD (PECVD), or FCVD. Dielectric materials may include a silicate glass such as phospho-silicate glass (PSG), boro-silicate glass (BSG), boron-doped phospho-silicate glass (BPSG), undoped silicate glass (USG), or the like. Other insulation materials formed by any acceptable process may be used. In some embodiments, a contact etch stop layer (CESL) 80 is disposed between the first ILD layer 82 and the epitaxial source/drain regions 70, the gate spacers 66, and the masks 64. The CESL 80 may comprise a dielectric material, such as, silicon nitride, silicon oxide, silicon oxynitride, or the like, having a different etch rate than the material of the overlying first ILD layer 82.

Figure 6B:
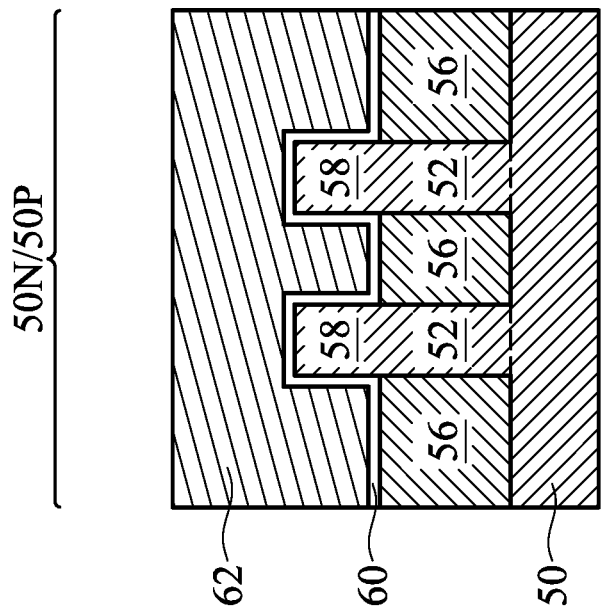
Figure 6A:
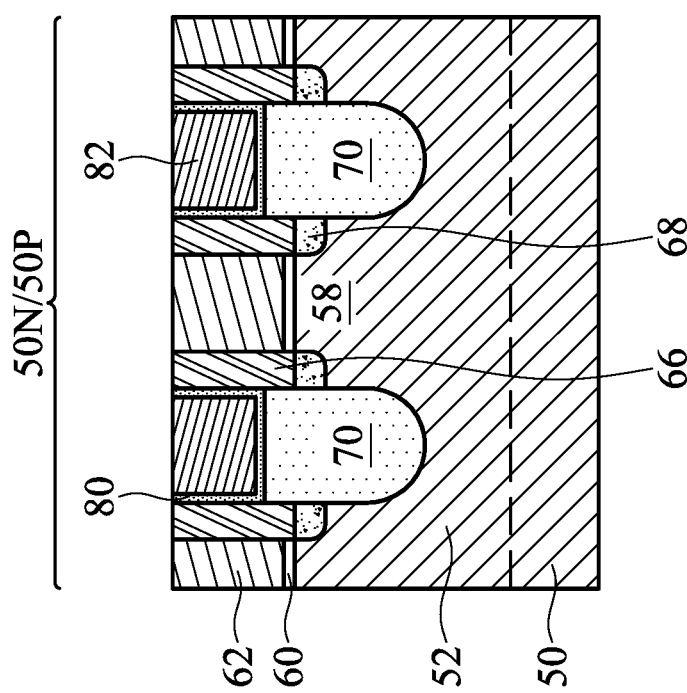

In FIGS. 6A and 6B, a planarization process, such as a CMP, may be performed to level the top surface of the first ILD layer 82 with the top surfaces of the dummy gate electrodes 62 or the masks 64. The planarization process may also remove the masks 64 on the dummy gate electrodes 62, and portions of the gate spacers 66 along sidewalls of the masks 64. After the planarization process, top surfaces of the dummy gate electrodes 62, the gate spacers 66, and the first ILD layer 82 are level. Accordingly, the top surfaces of the dummy gate electrodes 62 are exposed through the first ILD layer 82. In some embodiments, the masks 64 may remain, in which case the planarization process levels the top surface of the first ILD layer 82 with the top surfaces of the masks 64.

Figure 7B:
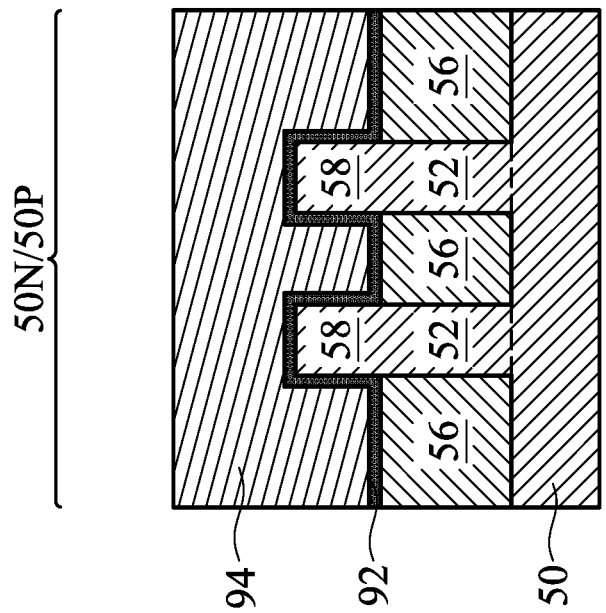
Figure 7A:
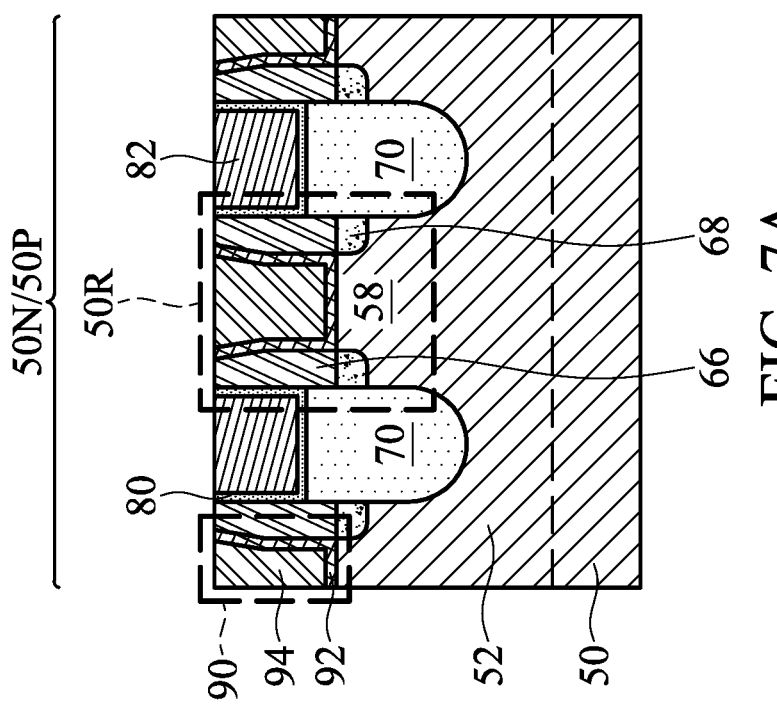

In FIGS. 7A and 7B, the dummy gate electrodes 62 and optionally the dummy gate dielectrics 60 are removed and are replaced with replacement gates 90. The replacement gates 90 include gate dielectrics 92 and gate electrodes 94. As discussed further below, the replacement gates 90 are formed having funnel shapes, where lower portions of the replacement gates 90 have parallel opposing sidewalls, and upper portions of the replacement gates 90 have slanted opposing sidewalls. Forming the replacement gates 90 with funnel shapes can help avoid the formation of seams (or voids) in the gate electrodes 94, which can improve the work function of the gate electrodes 94 and reduce the internal gate resistance ($R_g$) of the gate electrodes 94. The performance and yield of the resulting FinFETs may thus be improved.

FIGS. 8A through 8G are various views of intermediate stages of a process for forming the replacement gates 90, in accordance with some embodiments. A region 50R in FIG. 7A is illustrated in more detail. In the illustrated process, the dummy gate dielectrics 60 and dummy gate electrodes 62 are removed and replaced with replacement gates 90. In some embodiments, the dummy gate dielectrics 60 are removed in a first region of a die (e.g., a core logic region) and remain in a second region of the die (e.g., an input/output region). In other words, the illustrated gate replacement process can be performed in the first region of the die (e.g., the core logic region), and a gate replacement process where the dummy gate dielectrics 60 are not removed can be performed in the second region of the die (e.g., the input/output region).

Figure 8A:
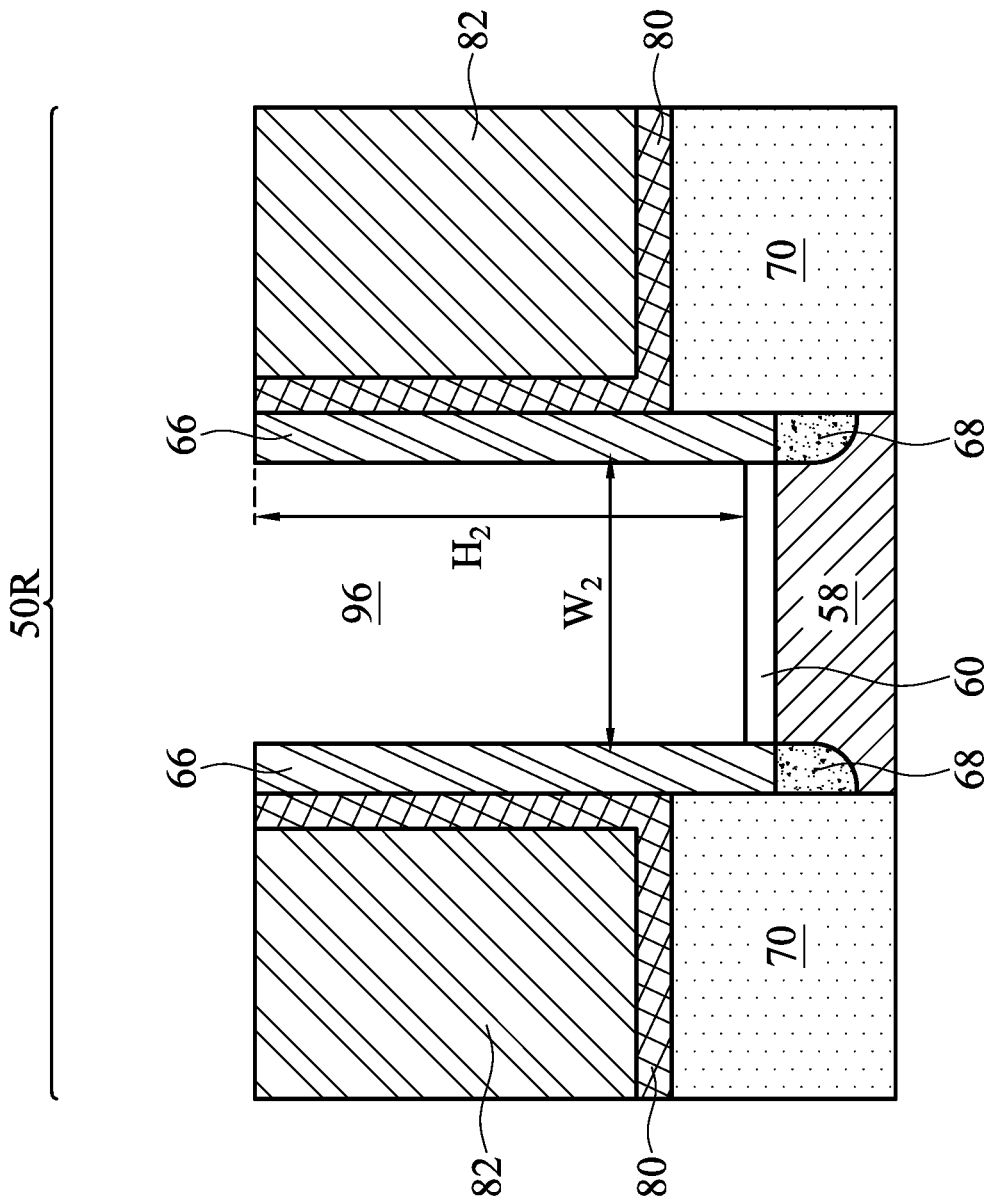
FIGS. 8A, 8B, 8C, 8D, 8E, 8F, and 8G are various views of intermediate stages in the manufacturing of replacement gates, in accordance with some embodiments.

In FIG. 8A, the dummy gate electrodes 62, and the masks 64 if present, are removed in one or more etching step(s), so that recesses 96 are formed. In some embodiments, the dummy gate electrodes 62 are removed by an anisotropic dry etch process. For example, the etching process may include a dry etch process using reaction gas(es) that selectively etch the dummy gate electrodes 62 without etching the first ILD layer 82 or the gate spacers 66. During the removal, the dummy gate dielectrics 60 may be used as etch stop layers when the dummy gate electrodes 62 are etched. Each recess 96 exposes a dummy gate dielectric 60 and overlies a channel region 58 of a respective fin 52. Each channel region 58 is disposed between neighboring pairs of the epitaxial source/drain regions 70.

The recesses 96 can be small. For example, the recesses 96 can have a width $W_2$ in the range of about 10 nm to about 25 nm, and can have a height $H_2$ in the range of about 6 nm to about 90 nm. The width $W_2$ of the recesses 96 corresponds to the length of the respective channel regions 58. Forming the channel region 58 (and thus recesses 96) to a short length can improve the performance of the resulting FinFETs. However, forming the channel regions 58 to a short length results in the recesses 96 having a high aspect ratio (e.g., ratio of the height $H_2$ to the width $W_2$). When the recesses 96 have a high aspect ratio, seams (or voids) are likely to form in material deposited in the recess 96. As discussed further below, the recesses 96 will be widened to have funnel shapes, which can help avoid the formation of such seams.

Figure 8B:
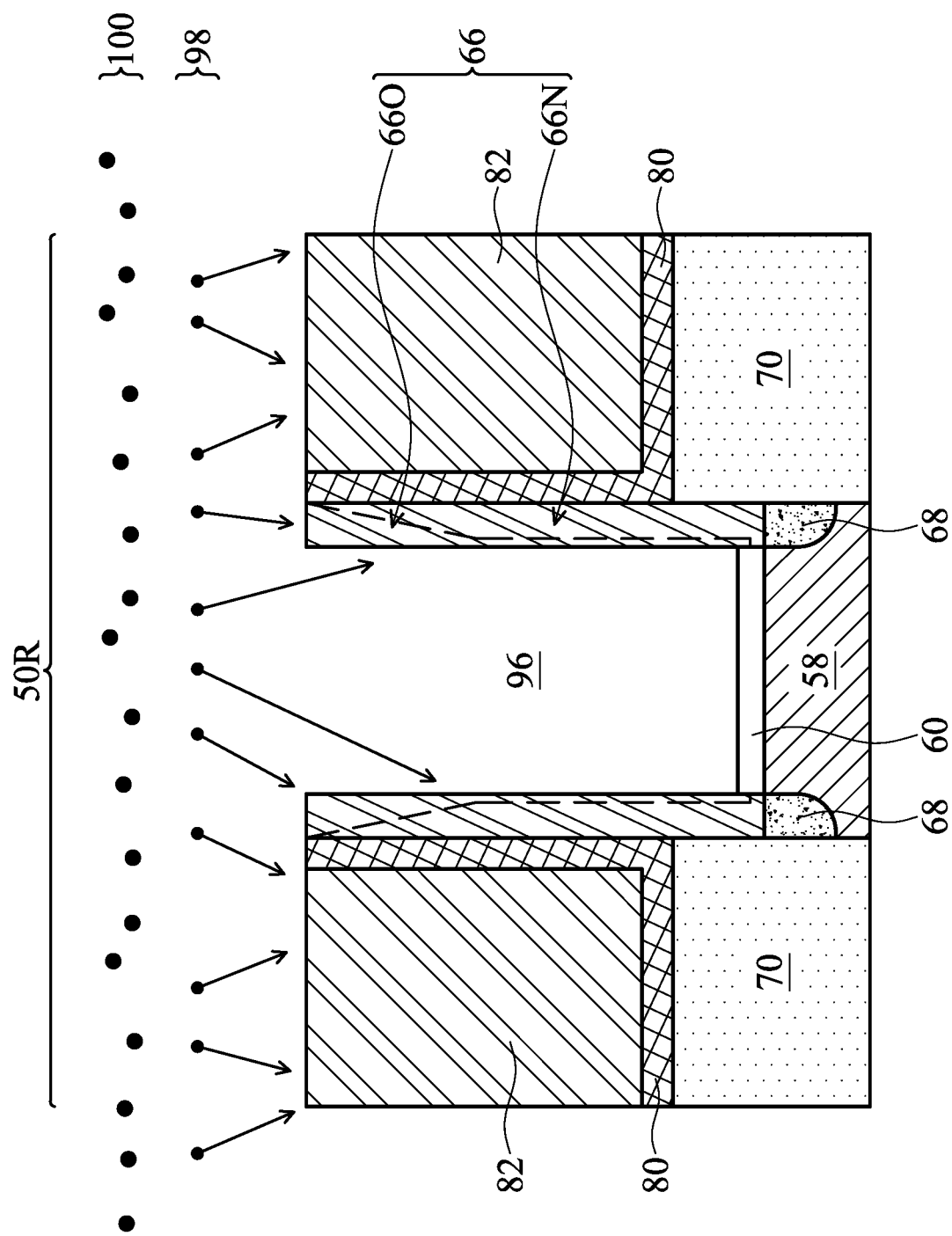

In FIG. 8B, an impurity is implanted in first regions of the gate spacers 66 to modify an etch rate of the first regions of the gate spacers 66 as compared to second regions of the gate spacers that have not been implanted with the impurity. As discussed in greater detail below, the first regions of the gate spacers 66 will be etched to widen the recess 96 to reduce or prevent formation of voids or seams when subsequently filling the recess 96. Second regions of the gate spacers 66 remain unmodified or less modified during/after the impurity implantation. In embodiments in which the gate spacers 66 comprise silicon oxycarbonitride as discussed above, the impurity may be oxygen, and implantation is by a plasma oxidation process. The plasma oxidation process oxidizes regions 66O of the gate spacers 66, with unoxidized regions 66N of the gate spacers 66 being unaffected by the plasma oxidation process.

The oxidized regions 66O of the gate spacers 66 are oxygen-rich. For example, the oxidized regions 66O and unoxidized region 66N of the gate spacers 66 can both comprise silicon oxycarbonitride, with the oxidized regions 66O having a greater concentration (e.g., percent by mass) of oxygen than the unoxidized region 66N of the gate spacers 66 after the implantation. In some embodiments, the unoxidized region 66N of the gate spacers 66 retain their initial concentration of oxygen. As discussed further below, an etch selective to the doped (e.g., oxygen-rich) regions will subsequently be performed to remove the oxidized regions 66O of the gate spacers 66 and thus widen the recesses 96. During the plasma oxidation process, the CESL 80 and first ILD layer 82 can also be implanted with oxygen, however, since these layers are formed of different materials than the gate spacers 66, no significant change in their etch selectivity occurs.

The plasma oxidation process may be performed by implantation. Implantation may be performed in a chamber, with a chuck in the chamber supporting the substrate 50. Precursor gases are provided to the chamber, and a plasma generator can be used to generate plasma from the precursor gases. The plasma generator may be an inductively coupled plasma (CIP) generator, a capacitively coupled plasma (CCP) generator, a remote plasma generator, or the like.

During the plasma oxidation process, a gas source is provided (e.g., flowed) over the substrate 50. The gas source includes an oxygen source precursor gas (e.g., oxygen gas ($O_2$)), an optional nitrogen source precursor gas (e.g., nitrogen gas ($N_2$)), and a carrier gas (e.g., xenon, helium, argon, neon, krypton, radon, the like, or combinations thereof). For example, in some embodiments, the gas source comprises oxygen, argon, and helium. In such embodiments, the oxygen source precursor gas is provided at a flow rate in the range of about 10 sccm to about 1000 sccm; the nitrogen source precursor gas (when present) is provided at a flow rate in the range of about 10 sccm to about 1000 sccm; and the carrier gas is provided at a flow rate in the range of about 10 sccm to about 1000 sccm.

Radio frequency (RF) power is generated by the plasma generator to produce a plasma from the gas source. The plasma includes oxygen ions 98 ($O^+$) and oxygen radicals 100 ($O^*$). A DC bias voltage is generated between the plasma generator and the chuck supporting the substrate 50. The DC bias voltage is a high-voltage negative offset and is pulsed to perform implantation. The oxygen ions 98 are accelerated across the plasma by the DC bias voltage and implanted into the gate spacers 66 to form the oxidized regions 66O. The DC bias voltage may be up to about 100 kV. In such embodiments, the resulting implantation energy of oxygen may be up to about 40 keV. The plasma oxidation process can be performed for a duration in the range of about 10 seconds to about 120 seconds, resulting in a dosage of the implanted oxygen being in the range of about $10^{15}$ cm$^{-3}$ to about $10^{19}$ cm$^{-3}$.

During the plasma oxidation process, the oxygen ions 98 collide with the oxygen radicals 100, which can result in a low directionality of implantation, causing shadowing during the implantation. In other words, the implant is performed in a non-directional manner. In accordance with some embodiments, the generated plasma includes few oxygen ions 98 and many oxygen radicals 100. For example, the generated plasma can comprise from about 0.1% to about 10% oxygen ions 98 and from about 90% to about 99.9% oxygen radicals 100. Generating the plasma with many oxygen radicals 100 results in the oxygen ions 98 colliding with more oxygen radicals 100 during implant, thus increasing the amount of shadowing and resulting in less oxygen ions 98 being directed towards the dummy gate dielectrics 60. As a result, a majority of the oxygen ions 98 are implanted at an acute incident angle with respect to a major surface of the structure (e.g., a topmost surface of the first ILD layer 82 or a major surface of the substrate 50). The incident angle can be small, such as in the range of about 3 degrees to about 50 degrees.

The amount of shadowing during the plasma oxidation process can be increased by controlling the environment when generating the plasma. Specifically, the temperature, pressure, and RF power can all affect the amount of oxygen ions 98 and oxygen radicals 100 that are generated. In accordance with some embodiments, the plasma is generated with a low temperature, pressure, and RF power. For example, the plasma can be generated at a temperature in the range of about room temperature (e.g., about 20° C.) to about 500° C., at a pressure in the range of about 200 mTorr to about 300 mTorr, and at an RF power in the range of about 200 watts to about 2000 watts. Such a plasma generation environment results in a large amount of shadowing during the implantation.

When the recess 96 have a high aspect ratio, implanting the oxygen ions 98 with a large amount of shadowing results in less oxygen ions 98 being implanted in lower portions of the recesses 96 than in upper portions of the recesses 96. Further, because of the large amount of shadowing, the oxidized regions 66O are formed by implanting the top surface and exposed sidewalls of the gate spacers 66, and thus the oxidized regions 66O have right triangular shapes. The shape of the gate spacers 66 resulting from the triangular-shaped regions 66O is discussed further below.

Figure 8C:
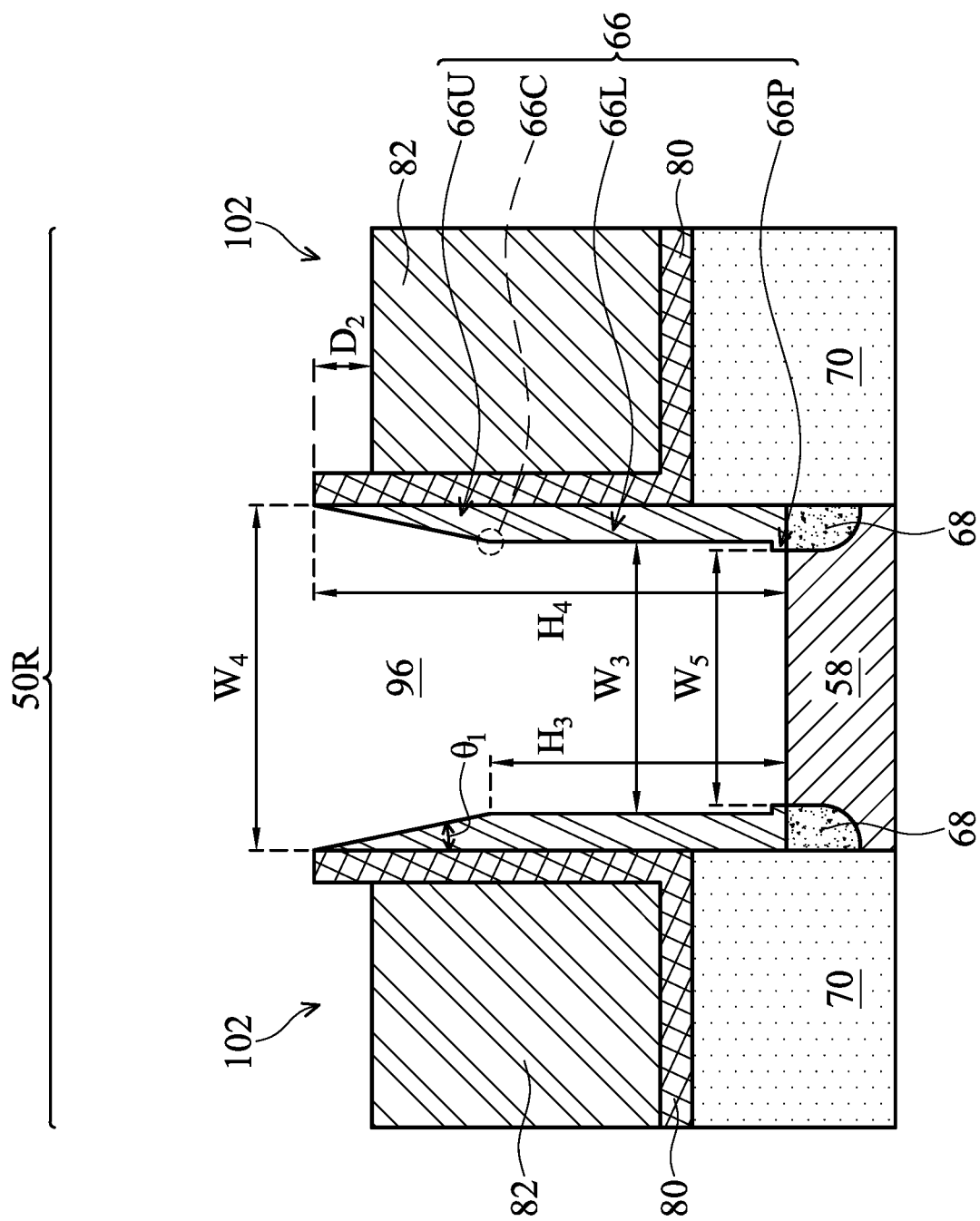

In FIG. 8C, the modified regions (e.g., oxidized regions 66O) of the gate spacers 66 are removed in one or more etching step(s), so that the recesses 96 are widened. The etching step(s) are selective to the impurity implanted in the gate spacers 66. For example, when the gate spacers 66 comprise silicon oxycarbonitride and the oxidized regions 66O are oxygen-rich regions, the etching process may include a dry etch using reaction gas(es) that are selective to oxides. Because the oxidized regions 66O have a greater concentration of oxygen than the unoxidized region 66N, the etching process etches the oxidized regions 66O at a greater rate than the unoxidized regions 66N. For example, the etch rate of the oxidized regions 66O can be from about 2 to about 100 times greater than the etch rate of the unoxidized region 66N relative the etching process. Further, because the dummy gate dielectrics 60 and first ILD layer 82 are also oxides, they are also etched at a high rate by the etching process. In some embodiments, the etching process removes the dummy gate dielectrics 60 to deepen the recesses 96, and recesses the first ILD layer 82 to form recesses 102. The recesses 102 can have a depth D2 in the range of about 10 nm to about 35 nm.

In some embodiments, the etching process is an anisotropic dry etch. For example, the dry etch can be performed with an etching gas solution that comprises ammonia (NH$_3$) and hydrogen fluoride (HF). The etching gas solution can be flowed over the substrate 50, such as in the recesses 96, while no plasma is generated. The dry etch can be performed for a duration in the range of about 10 second to about 30 seconds, and at a temperature of from about room temperature (e.g., about 20° C.) to about 200° C. The dry etch converts the material of the oxidized regions 66O, dummy gate dielectrics 60, and first ILD layer 82 to a plurality of byproducts. Depending on the etching temperature, the byproducts can include gas phase byproduct(s) (e.g., carbon, oxygen) and solid phase byproduct(s) (e.g., ammonium fluorosilicate). After the dry etch, a thermal treatment can be performed at a sufficiently high temperature and duration to sublimate the solid phase byproduct(s) and produce additional gas phase byproduct(s). For example, a thermal treatment can be performed at a temperature in the range of about 100° C. to about 150° C., at a pressure in the range of about 5 mTorr to about 10 Torr, and for a duration in the range of about 20 seconds to about 200 seconds. The thermal treatment is performed at a higher temperature than the dry etch. Once the solid phase byproduct is sublimated to a gas phase byproduct, it can be evacuated from the recesses 96 by, e.g., a vacuum.

In some embodiments, the etching process can include multiple cycles of the dry etch and the thermal treatment. The cycles can be performed until substantially all of the oxidized regions 66O and dummy gate dielectrics 60 are removed. For example, from about 3 to about 6 cycles of the dry etch and thermal treatment can be performed.

After the etching process, the unoxidized regions 66N of the of the gate spacers 66 remain. The remaining portions of the gate spacers 66 have upper portions 66U and lower portions 66L, which together form funnel shapes for the recesses 96. The widths of the upper portions 66U decrease continually in a direction extending away from the top surfaces of the fins 52. The widths of the lower portions 66L are constant along the direction extending away from the top surfaces of the fins 52. In some embodiments, the gate spacers 66 have interior corners 66C at the interfaces of the upper portions 66U and lower portions 66L. The interior corners 66C face one another and are exposed to the recesses 96. The interior corners 66C are disposed a height $H_3$ from the topmost surfaces of the fins 52. The height $H_3$ can be in the range of about 12 nm to about 30 nm. In some embodiments, the interfaces of the upper portions 66U and lower portions 66L do not have sharply-defined interior corners 66C, but rather have rounded interior corners 66C. The lower portions 66L have parallel opposing sidewalls, and are spaced apart by a width $W_3$. The width $W_3$ can be in the range of about 10 nm to about 25 nm. Because the unoxidized regions 66N of the gate spacers 66 can undergo some etching, the width $W_3$ is less than the width $W_2$ (see FIG. 8A). The upper portions 66U have angled sidewalls that meet at an apex. The opposing sidewalls of the upper portions 66U have an interior angle $\theta_1$. The angle $\theta_1$ can be in the range of about 1 degree to about 80 degrees. The respective apexes of the upper portions 66U are spaced apart by a width $W_4$. The width $W_4$ can be in the range of about 15 nm to about 40 nm. The apexes of the upper portions 66U are disposed a height $H_4$ from the topmost surfaces of the fins 52. The height $H_4$ can be in the range of about 45 nm to about 90 nm. The height $H_4$ is the final height of the recesses 96, and is greater than the initial height $H_2$ (see FIG. 8A) of the height of the recesses 96, by nature of removing the dummy gate dielectrics 60.

Widening the recesses 96 to have funnel shape(s) can help avoid pinch-off effects when filling the recesses 96, thus avoiding the formation of seams. A ratio of the width $W_4$ to the width $W_3$ can be in the range of about 1 to about 3, and a ratio of the height $H_4$ to the height $H_3$ can be in the range of about 1 to about 10. Such ratios help form a funnel shape that is conducive to avoiding pinch-off effects during subsequent filling. Values greater than or less than these ratios may not form funnel shapes that are conducive to avoiding pinch-off effects during subsequent filling.

In some embodiments, the remaining portions of the gate spacers 66 also include projecting portions 66P, which extend away from the lower portions 66L. The projecting portions 66P can be formed when the oxidized regions 66O (see FIG. 8B) extend down to the dummy gate dielectrics 60, such as when a small amount of oxygen ions 98 are implanted in the lower portions of the recesses 96. The widths of the projecting portions 66P are constant along the direction extending away from the top surfaces of the fins 52. The projecting portions 66P can be spaced apart by a width $W_5$, which can be in the range of about 10 nm to about 25 nm. The width $W_5$ is less than the width $W_3$.

Figure 8D:
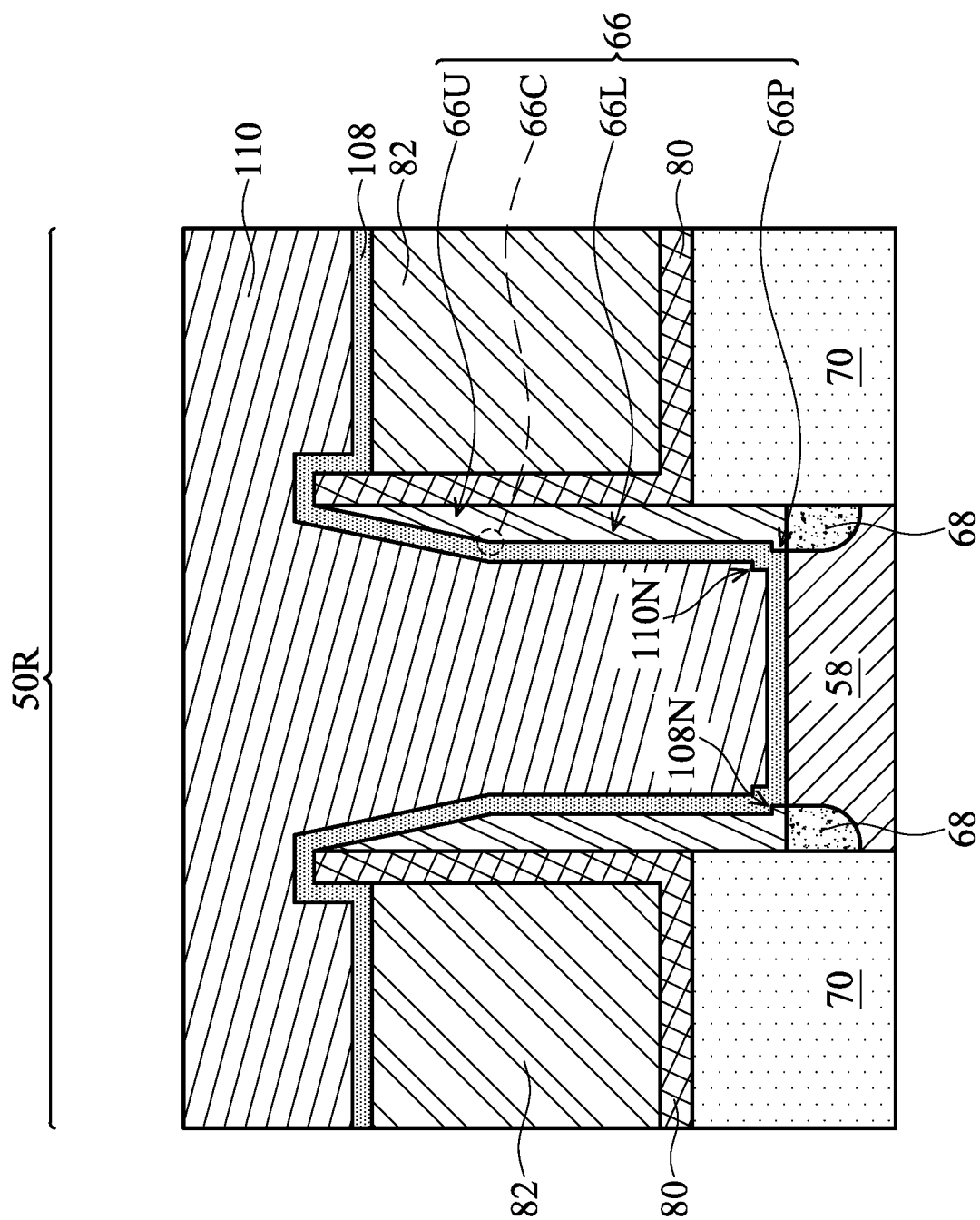

In FIG. 8D, a gate dielectric layer 108 and a gate electrode layer 110 are formed. The gate dielectric layer 108 is deposited conformally in the recesses 96 and 102, such as on the top surfaces and the sidewalls of the fins 52 and on sidewalls of the gate spacers 66. The gate dielectric layer 108 may also be formed on the top surface of the first ILD layer 82. When the gate spacers 66 have projecting portions 66P, the gate dielectric layer 108 has notches 108N where the projecting portions 66P extend into the gate dielectric layer 108. In accordance with some embodiments, the gate dielectric layer 108 comprises silicon oxide, silicon nitride, or multilayers thereof. In some embodiments, the gate dielectric layer 108 includes a high-k dielectric material, and in these embodiments, the gate dielectric layer 108 may have a k value greater than about 7.0, and may include a metal oxide or a silicate of hafnium, aluminum, zirconium, lanthanum, manganese, barium, titanium, lead, and combinations thereof. The formation methods of the gate dielectric layer 108 may include Molecular-Beam Deposition (MBD), ALD, PECVD, and the like. In embodiments where portions of the dummy gate dielectrics 60 remain in the recesses 96, the gate dielectric layer 108 includes a material of the dummy gate dielectric 60 (e.g., silicon oxide).

The gate electrode layer 110 is deposited over the gate dielectric layer 108, and fills the remaining portions of the recesses 96 and 102. When the gate dielectric layer 108 has notches 108N, the gate electrode layer 110 has notches 110N where the notches 108N extend into the gate electrode layer 110. The gate electrode layer 110 may include a metal-containing material such as titanium nitride, titanium oxide, tantalum nitride, tantalum carbide, cobalt, ruthenium, aluminum, tungsten, combinations thereof, or multi-layers thereof. For example, although a single gate electrode layer 110 is illustrated, the gate electrode layer 110 may comprise any number of liner layers, any number of work function tuning layers, and a fill material.

Figure 8E:
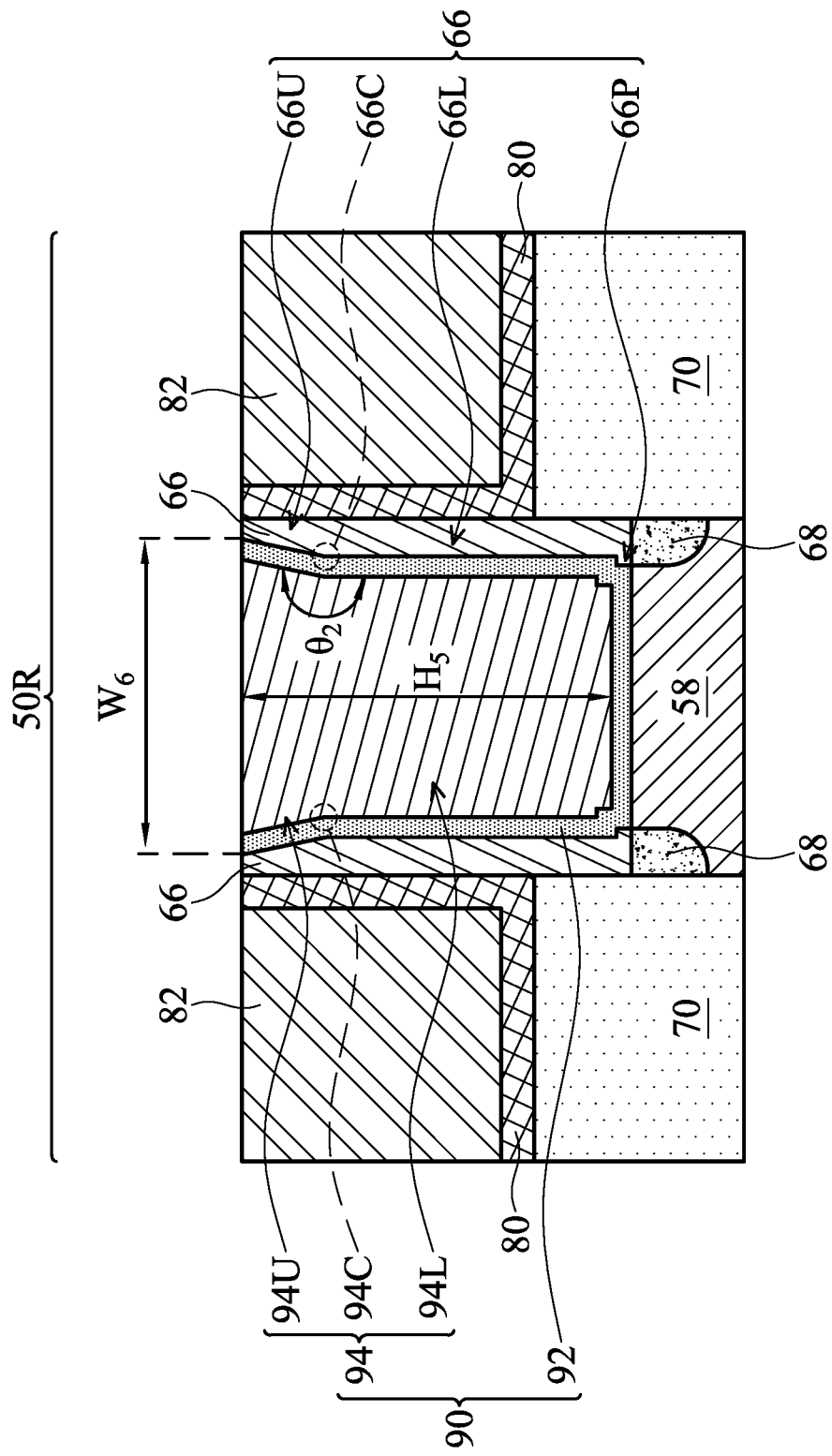

In FIG. 8E, a planarization process, such as a CMP, is performed to remove the excess portions of the gate dielectric layer 108 and the gate electrode layer 110, which excess portions are outside of the recesses 96, e.g., over the top surface of the first ILD layer 82. The remaining portions of the gate dielectric layer 108 and gate electrode layer 110, respectively, form the gate dielectrics 92 and gate electrodes 94, which together form the replacement gates 90. The replacement gates 90 may also be referred to as "gate stacks" or "metal gate stacks." The replacement gates 90 may extend along sidewalls of a channel region 58 of the fins 52.

The steps discussed with respect to FIGS. 8D and 8E may be performed simultaneously in the region 50N and the region 50P, or may be performed separately in the region 50N and the region 50P. In some embodiments, the gate dielectrics 92 in each region may be formed by distinct processes, such that the gate dielectrics 92 may be different materials, and/or the gate electrodes 94 in each region may be formed by distinct processes, such that the gate electrodes 94 may be different materials. Various masking steps may be used to mask and expose appropriate regions when using distinct processes.

After the planarization process, the replacement gates 90 have a reduced height $H_5$, measured from the topmost surfaces of the fins 52. The height $H_5$ can be in the range of about 10 nm to about 30 nm. Further, after the planarization process, the replacement gates 90 have a width $W_6$ measured at their topmost surfaces. The width $W_6$ can be in the range of about 3 nm to about 300 nm. The widths $W_6$ of the replacement gates 90 can vary across a same substrate 50, such as in embodiments where devices of different channel region lengths are formed.

In some embodiments, the upper portions 66U of the gate spacers 66 remain after the planarization process, as illustrated by FIG. 8E. As such, the height $H_5$ is less than the height $H_4$ and greater than the height $H_3$ (see FIG. 8C), and the width $W_6$ is less than the width $W_4$ and greater than the width $W_3$ (see FIG. 8C). The gate electrodes 94 thus have upper portions 94U and lower portions 94L, which together form funnel shapes. The widths of the upper portions 94U increase continually in a direction extending away from the top surfaces of the fins 52. The widths of the lower portions 94L are constant along the direction extending away from the top surfaces of the fins 52. The widths of the gate dielectrics 92 are constant along the sidewalls of the gate electrodes 94. The gate electrodes 94 have interior corners 94C at the interfaces of the upper portions 94U and lower portions 94L. Sidewalls of the gate electrodes 94 form an interior angle $\theta_2$ at the interior corners 94C of the gate electrodes 94, with the difference between the interior angle $\theta_2$ and the interior angle $\theta_1$ (see FIG. 8C) being equal to 180 degrees. In other words, the interior angle $\theta_2$ can be in the range of about 181 degrees to about 260 degrees.

Figure 8F:
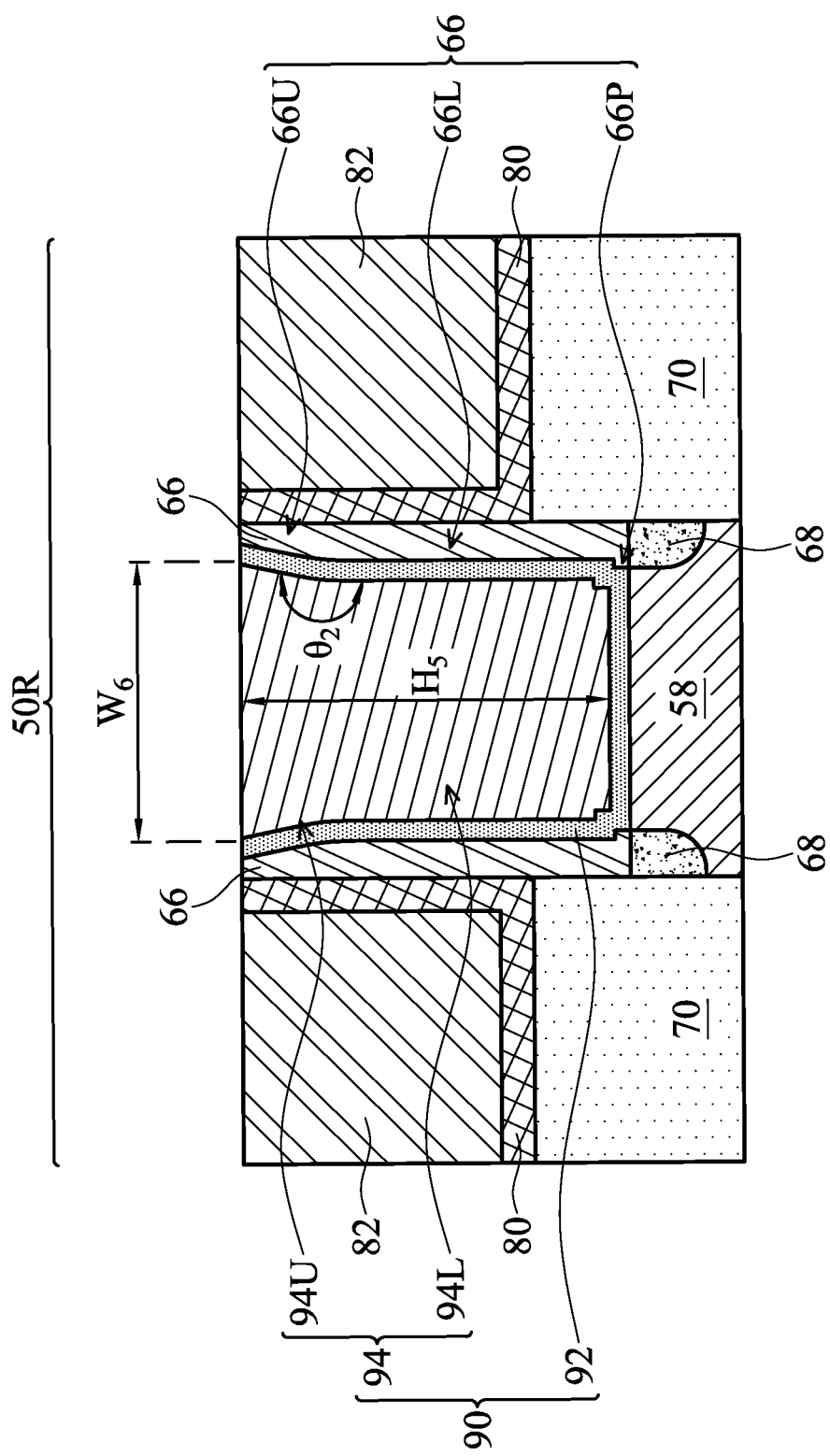

In some embodiments, the gate electrodes 94 have rounded interior corners instead of sharp interior corners at the interfaces of the upper portions 94U and lower portions 94L, as illustrated by FIG. 8F. Planes parallel to the sidewalls of the gate electrodes 94 can still form an angle $\theta_2$ in the range of about 181 degrees to about 260 degrees, but the interior corner itself may not form such an angle.

Figure 8G:
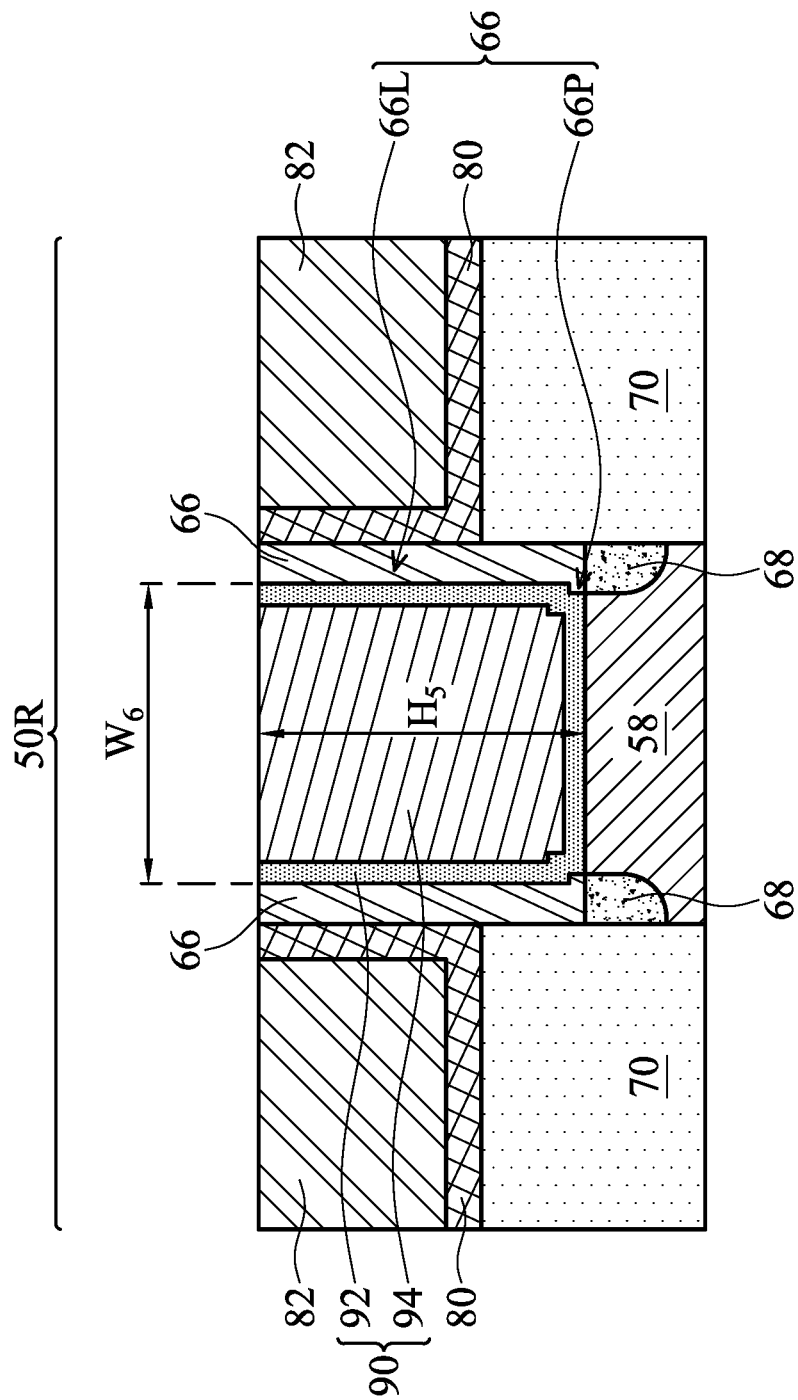

In some embodiments, the upper portions 66U of the gate spacers 66 are removed by the planarization process, as illustrated by FIG. 8G. As such, the height $H_5$ is less than the height $H_3$ (see FIG. 8C), and the width $W_6$ is equal to the width $W_3$ (see FIG. 8C). The gate electrodes 94 thus have straight sidewalls, lacking interior angles. In such embodiments, only the lower portions 66L and projecting portions 66P of the gate spacers 66 remain.

The embodiments described with respect to FIGS. 8A through 8G are discussed in the context of an oxygen implantation. However, it should be appreciated that any impurity may be implanted (see FIG. 8B) in the gate spacers 66 to modify an etch rate of portions of the gate spacers 66. An etch (see FIG. 8C) selective to the impurity may be then performed to remove the modified portions of the gate spacers 66 and widen the recesses 96.

Figure 9B:
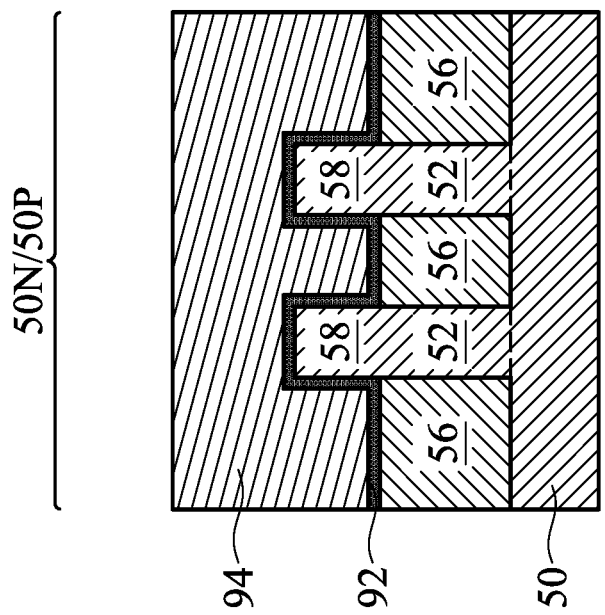
FIGS. 9A, 9B, 10A, 10B, 11A, 11B, and 11C are various views of further intermediate stages in the manufacturing of FinFETs, in accordance with some embodiments.
Figure 9A:
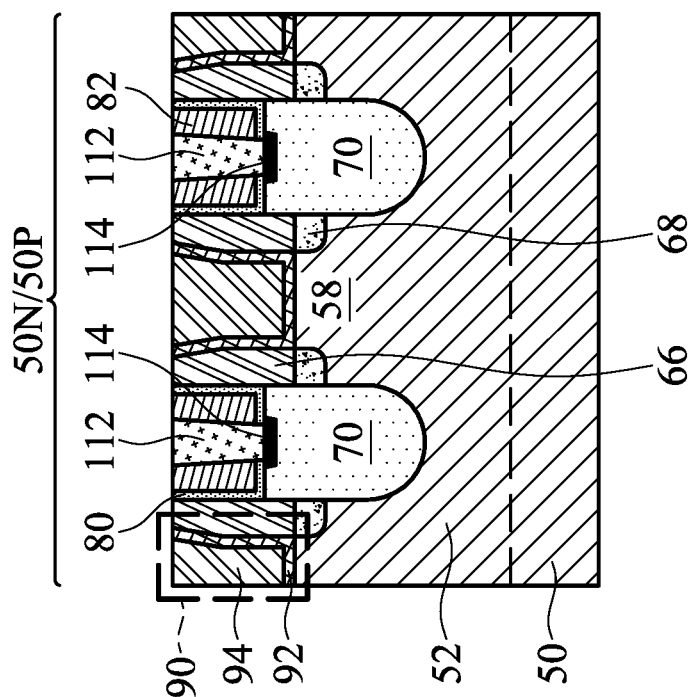

In FIGS. 9A and 9B, lower source/drain contacts 112 are formed to the epitaxial source/drain regions 70. Openings for the lower source/drain contacts 112 are formed through the first ILD layer 82 and CESL 80. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from top surfaces of the first ILD layer 82 and replacement gates 90. The remaining liner and conductive material form the lower source/drain contacts 112 in the openings. An anneal process may be performed to form a silicide 114 at the interface between the epitaxial source/drain regions 70 and the lower source/drain contacts 112. The lower source/drain contacts 112 are physically and electrically coupled to the epitaxial source/drain regions 70.

Figure 10A:
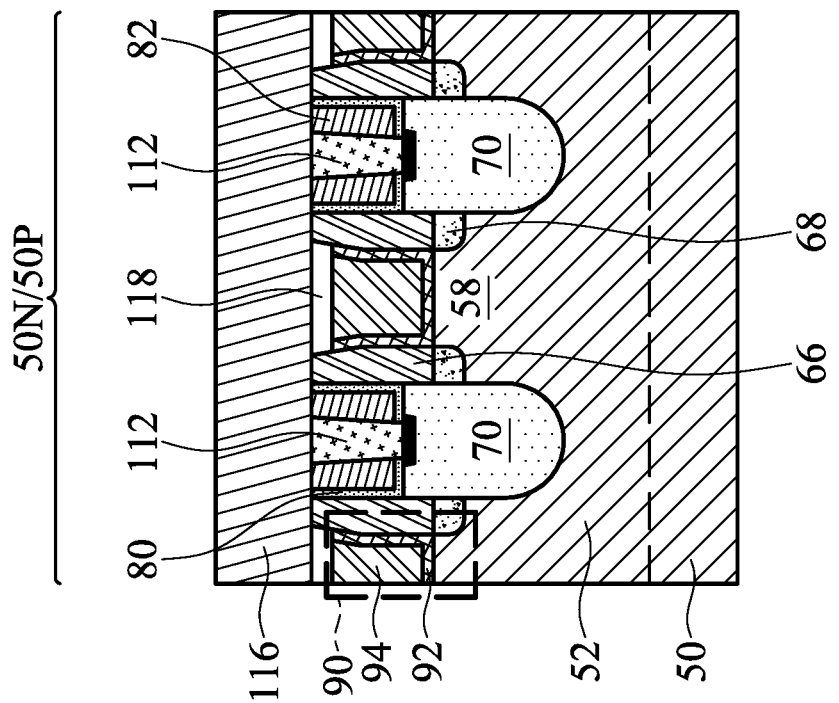
Figure 10B:
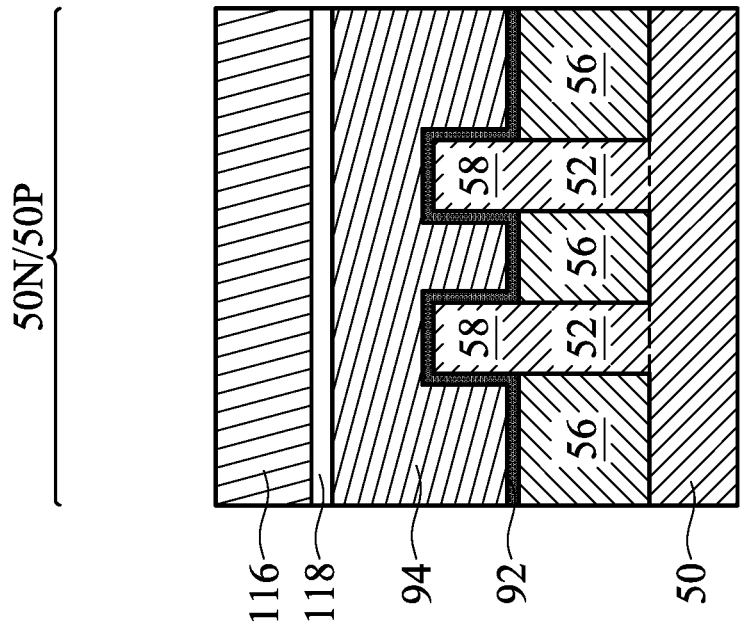

In FIGS. 10A and 10B, a second ILD layer 116 is deposited over the first ILD layer 82. In some embodiment, the second ILD layer 116 is a flowable film formed by a flowable CVD method. In some embodiments, the second ILD layer 116 is formed of a dielectric material such as PSG, BSG, BPSG, USG, or the like, and may be deposited by any suitable method, such as CVD and PECVD. In accordance with some embodiments, before the formation of the second ILD layer 116, the replacement gates 90 can be recessed, so that recesses are formed directly over the replacement gates 90 and between opposing portions of the gate spacers 66. Gate masks 118 comprising one or more layers of dielectric material, such as silicon nitride, silicon oxynitride, or the like, are filled in the recesses, followed by a planarization process to remove excess portions of the dielectric material extending over the first ILD layer 82.

Figure 11B:
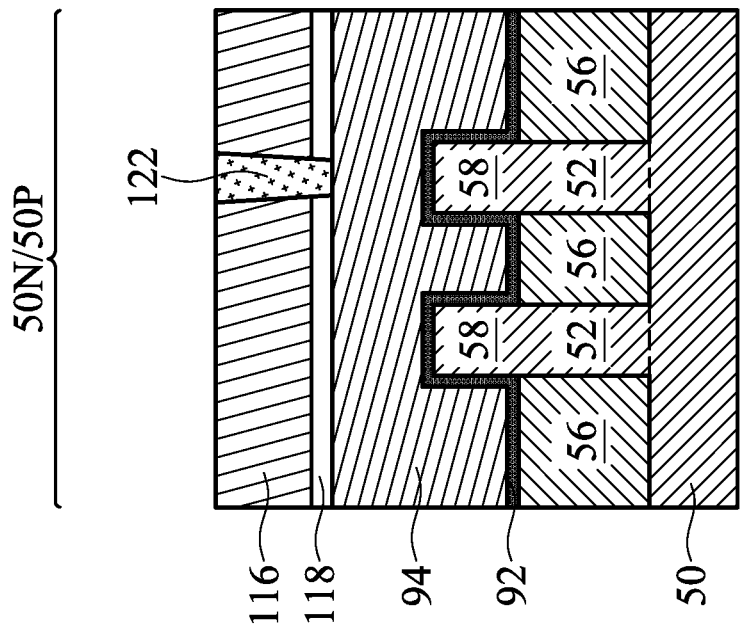
Figure 11A:
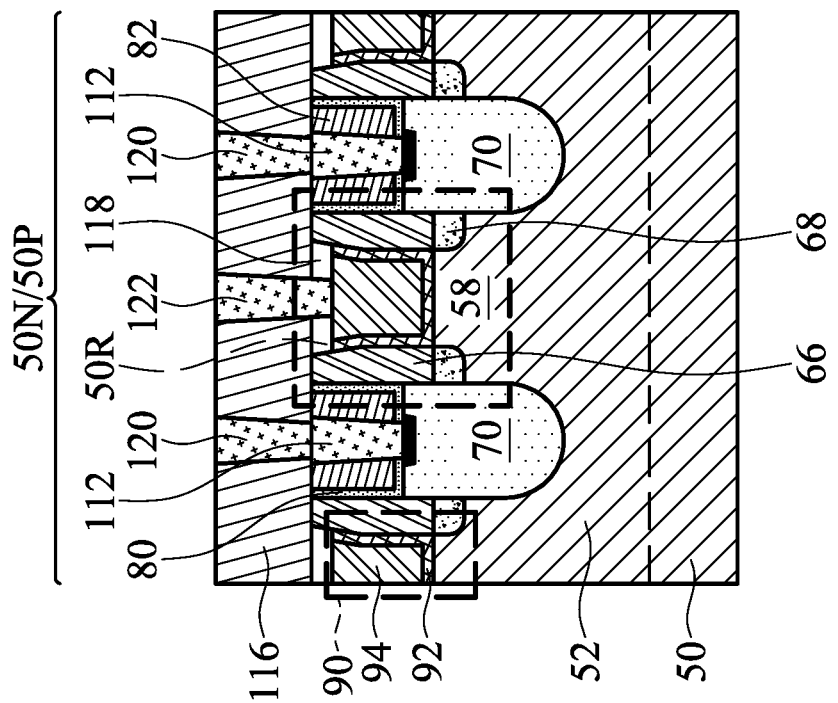

In FIGS. 11A and 11B, upper source/drain contacts 120 and gate contacts 122 are formed through the second ILD layer 116. Openings for the upper source/drain contacts 120 are formed through the second ILD layer 116, and openings for the gate contacts 122 are formed through the second ILD layer 116 and the gate masks 118. The openings may be formed using acceptable photolithography and etching techniques. A liner, such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from a top surface of the second ILD layer 116. The remaining liner and conductive material form the upper source/drain contacts 120 and gate contacts 122 in the openings. The upper source/drain contacts 120 are physically and electrically coupled to the lower source/drain contacts 112, and the gate contacts 122 are physically and electrically coupled to the gate electrodes 94. The upper source/drain contacts 120 and gate contacts 122 may be formed in different processes, or may be formed in the same process. Although shown as being formed in the same cross-sections, it should be appreciated that each of the upper source/drain contacts 120 and gate contacts 122 may be formed in different cross-sections, which may avoid shorting of the contacts.

Figure 11C:
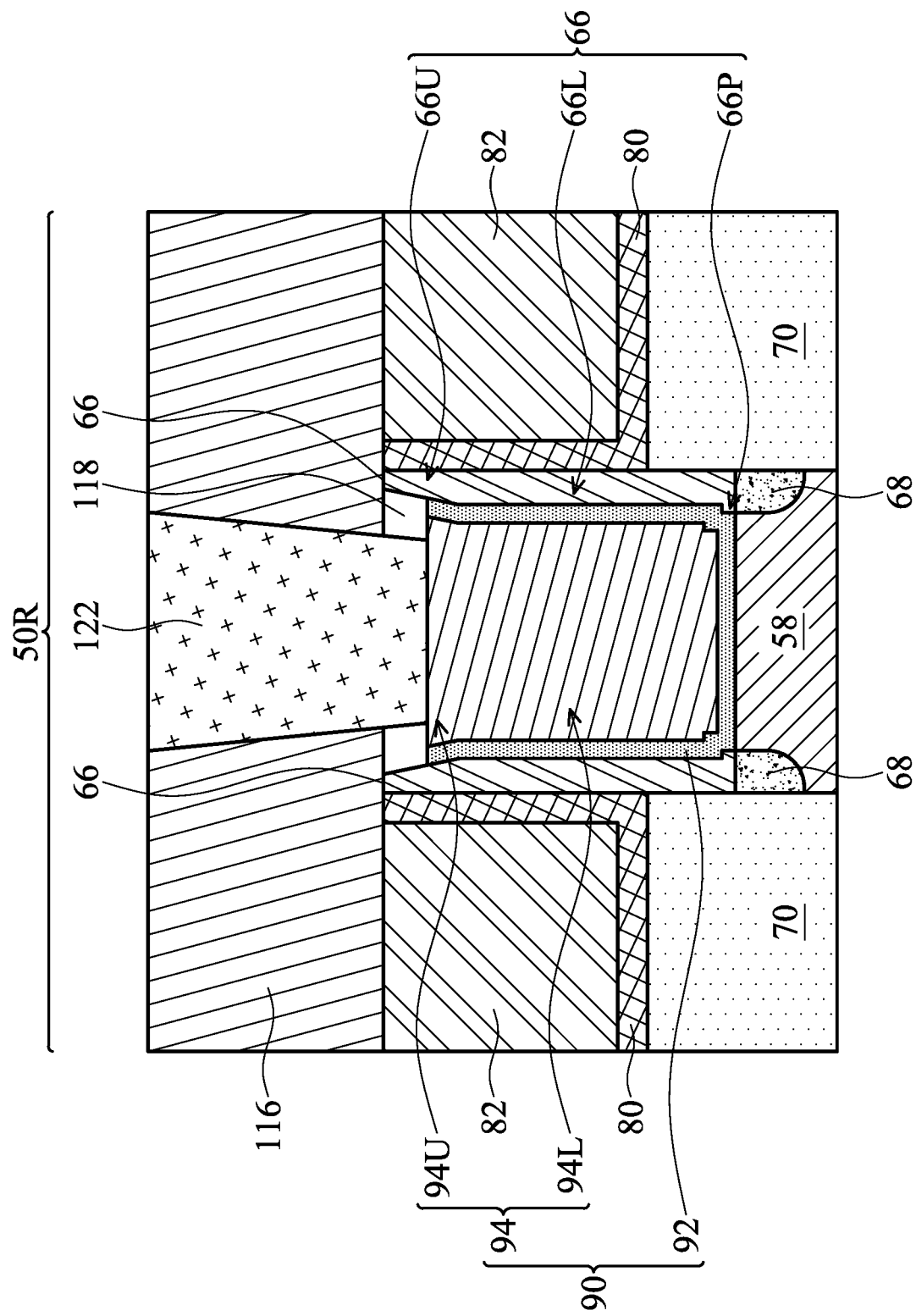

FIG. 11C is a cross-sectional view illustrating a region 50R from FIG. 11A in more detail. In embodiments where the upper portions 66U of the gate spacers 66 remain, the gate masks 118 can be formed extending into the upper portions 94U of the gate electrodes 94. The gate masks 118 can thus have slanted sidewalls.

Embodiments may achieve advantages. Performing an impurity implantation allows the first regions of the gate spacers 66 (e.g., the regions 66O) to be modified without modifying the second regions of the gate spacers 66 (e.g., the regions 66N). An etch selective to the impurity may thus be performed to remove the first regions of the gate spacers 66 (e.g., the regions 66O) without substantially etching the second regions of the gate spacers 66 (e.g., the regions 66N). As such, the recesses 96 have upper portions that continually increase in width in a direction extending away from the fins 52. Forming the recesses 96 with such a shape can help avoid pinch-off effects when filling the recesses 96 with the gate electrode layer 110, particularly when the gate electrode layer 110 includes multiple sub-layers, such as multiple work function tuning layers. The gap filling window for the gate electrode layer 110 may thus be improved, which may be particularly advantageous when forming work function tuning layers of particular desired thicknesses. Improving the gap filling window for the gate electrode layer 110 can avoid or reduce the formation of seams (or voids) in the gate electrodes 94. The work function and internal gate resistance ($R_g$) of the gate electrodes 94 may thus be improved, thereby increasing the performance and yield of the resulting FinFETs.

In an embodiment, a method includes: forming a dummy gate dielectric over a semiconductor substrate; forming a dummy gate electrode over the dummy gate dielectric; depositing a gate spacer adjacent the dummy gate electrode and the dummy gate dielectric; removing the dummy gate electrode to form a recess exposing a first region and a second region of the gate spacer; implanting an impurity in the first region of the gate spacer to increase an etch rate of the first region of the gate spacer, the second region of the gate spacer remaining unmodified by the implanting; removing the dummy gate dielectric and the first region of the gate spacer; and forming a replacement gate in the recess.

In some embodiments of the method, the impurity is oxygen, and implanting the impurity in the first region of the gate spacer includes: flowing a gas source including an oxygen source precursor gas and a carrier gas over the semiconductor substrate; generating a plasma from the gas source, the plasma including oxygen ions and oxygen radicals; and accelerating the oxygen ions in the plasma towards the gate spacer in a non-directional manner. In some embodiments of the method, the plasma includes from 0.1% to 10% oxygen ions and from 90% to 99.9% oxygen radials. In some embodiments of the method, the plasma is generated at a temperature in a range of 20° C. to 500° C., at a pressure in a range of 200 mTorr to 300 mTorr, and at an RF power in a range of 200 to 2000 watts. In some embodiments of the method, during the implanting, a majority of the oxygen ions are accelerated towards the gate spacer at an acute angle with respect to a major surface of the semiconductor substrate, the acute angle being in a range of 3 degrees to 50 degrees. In some embodiments of the method, removing the dummy gate dielectric and the first region of the gate spacer includes: performing an anisotropic dry etch with an etching gas solution in the recess, the etching gas solution converting the dummy gate dielectric and the first region of the gate spacer to a solid phase byproduct; performing a thermal treatment to sublimate the solid phase byproduct to a gas phase byproduct; and evacuating the gas phase byproduct from the recess. In some embodiments of the method, the impurity includes oxygen, the gate spacer includes silicon oxycarbonitride, the etching gas solution includes ammonia and hydrogen fluoride, and the solid phase byproduct includes ammonium fluorosilicate. In some embodiments of the method, the anisotropic dry etch is performed at a first temperature, and the thermal treatment is performed at a second temperature, the second temperature being greater than the first temperature. In some embodiments of the method, the first temperature is in a range of 20° C. to 200° C., and the second temperature is in a range of 100° C. to 150° C. In some embodiments, the method further includes: repeating from 3 to 6 cycles of the anisotropic dry etch and the thermal treatment.

In an embodiment, a structure includes: a semiconductor substrate; a gate spacer over the semiconductor substrate, the gate spacer having a first sidewall and a second sidewall opposite the first sidewall; an epitaxial source/drain region adjacent the first sidewall of the gate spacer; a gate dielectric extending along the second sidewall of the gate spacer and a top surface of the semiconductor substrate; and gate electrode over the gate dielectric, the gate electrode having an upper portion and a lower portion, a first width of the upper portion increasing continually in a first direction extending away from the top surface of the semiconductor substrate, a second width of the lower portion being constant along the first direction.

In some embodiments of the structure, the gate electrode includes an interior corner at an interface of the upper portion and the lower portion, sidewalls of the gate electrode forming an angle at the interior corner. In some embodiments of the structure, the angle is in a range of 181 degrees to 260 degrees. In some embodiments of the structure, the gate spacer has an upper portion and a lower portion, a third width of the upper portion decreasing continually in the first direction, a fourth width of the lower portion being constant along the first direction. In some embodiments of the structure, the gate spacer has a projecting portion extending from the lower portion, the projecting portion extending into the gate dielectric. In some embodiments, the structure further includes: a gate mask over the gate electrode and the gate dielectric, the gate mask having slanted sidewalls; and gate contact extending through the gate mask to contact the gate electrode.

In an embodiment, a structure includes: a semiconductor substrate; a gate spacer over the semiconductor substrate, the gate spacer having an upper portion and a lower portion, a first width of the upper portion decreasing continually in a first direction extending away from a top surface of the semiconductor substrate, a second width of the lower portion being constant along the first direction; a gate stack extending along a first sidewall of the gate spacer and the top surface of the semiconductor substrate; and an epitaxial source/drain region adjacent a second sidewall of the gate spacer.

In some embodiments of the structure, the gate spacer has a projecting portion extending from the first sidewall of the lower portion into the gate stack. In some embodiments of the structure, the gate stack includes: a gate dielectric extending along the first sidewall of the gate spacer and the top surface of the semiconductor substrate, the gate dielectric having a first notch where the projecting portion of the gate spacer extends into the gate dielectric; and a gate electrode on the gate dielectric, the gate electrode having a second notch where the first notch of the gate dielectric extends into the gate electrode. In some embodiments of the structure, the gate spacer includes silicon oxycarbonitride.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A structure comprising:
   a gate spacer over a semiconductor substrate, the gate spacer having a first sidewall and a second sidewall opposite the first sidewall, wherein the gate spacer has an upper portion, a lower portion, and a projecting portion extending from the lower portion;
   an epitaxial source/drain region adjacent the first sidewall of the gate spacer;
   a gate dielectric extending along the second sidewall of the gate spacer and a top surface of the semiconductor substrate, wherein the projecting portion of the gate spacer extends into the gate dielectric;
   a gate electrode over the gate dielectric, the gate electrode having an upper portion and a lower portion, a first width of the upper portion of the gate electrode increasing continually in a first direction extending away from the top surface of the semiconductor substrate, a second width of the lower portion of the gate electrode being constant along the first direction;
   a gate mask over the gate electrode and the gate dielectric, a third width of the gate mask increasing continually in the first direction; and
   a gate contact extending through the gate mask to contact the gate electrode.

2. The structure of claim 1, wherein the gate electrode comprises an interior corner at an interface of the upper portion of the gate electrode and the lower portion of the gate electrode, sidewalls of the gate electrode forming an angle at the interior corner.

3. The structure of claim 2, wherein the angle is in a range of 181 degrees to 260 degrees.

4. The structure of claim 2, wherein the interior corner is a rounded interior corner.

5. The structure of claim 2, wherein the interior corner is a sharp interior corner.

6. The structure of claim 1, wherein a fourth width of the upper portion of the gate spacer decreases continually in the first direction, and a fifth width of the lower portion of the gate spacer is constant along the first direction.

7. The structure of claim 1, wherein the gate spacer comprises silicon oxycarbonitride.

8. The structure of claim 1, wherein the gate dielectric has a first notch where the projecting portion of the gate spacer extends into the gate dielectric, and the gate electrode has a second notch where the first notch of the gate dielectric extends into the gate electrode.

9. A structure comprising:
a gate spacer over a semiconductor substrate, the gate spacer having an upper portion and a lower portion, a first width of the upper portion decreasing continually in a first direction extending away from a top surface of the semiconductor substrate, a second width of the lower portion being constant along the first direction;
a gate structure comprising a gate dielectric and a gate electrode on the gate dielectric, the gate dielectric extending along the upper portion of the gate spacer, the lower portion of the gate spacer, and the top surface of the semiconductor substrate, wherein the gate spacer has a projecting portion extending from the lower portion of the gate spacer and into the gate structure, the gate dielectric having a first notch where the projecting portion of the gate spacer extends into the gate dielectric;
a gate mask over the gate structure, the gate mask extending along the upper portion of the gate spacer; and
an epitaxial source/drain region, wherein adjacent a second sidewall of the gate spacer is disposed between the epitaxial source/drain region and the gate structure.

10. The structure of claim 9, wherein the gate electrode has a second notch where the first notch of the gate dielectric extends into the gate electrode.

11. The structure of claim 9, wherein the gate spacer comprises silicon oxycarbonitride.

12. The structure of claim 9 further comprising:
a gate contact extending through the gate mask to contact the gate structure.

13. A structure comprising:
an isolation region;
a semiconductor fin protruding above the isolation region;
a gate structure extending along a sidewall of the semiconductor fin and along a top surface of the isolation region, an upper portion of the gate structure having slanted sidewalls, a lower portion of the gate structure having parallel sidewalls, the gate structure comprising a gate dielectric and a gate electrode on the gate dielectric;
a gate mask over the gate structure, the gate mask having slanted sidewalls; and
gate spacers extending along the parallel sidewalls of the lower portion of the gate structure, along the slanted sidewalls of the upper portion of the gate structure, and along the slanted sidewalls of the gate mask, wherein the gate spacers include projecting portions extending into the gate structure, the gate dielectric having first notches where the projecting portions of the gate spacers extend into the gate dielectric, the gate electrode having second notches where the first notches of the gate dielectric extend into the gate electrode.

14. The structure of claim 13 further comprising:
a gate contact extending through the gate mask to contact the gate structure.

15. The structure of claim 13, wherein a first distance between the slanted sidewalls of the upper portion of the gate structure increases continually in a first direction extending away from the top surface of the isolation region, and a second distance between the slanted sidewalls of the gate mask increases continually in the first direction.

16. The structure of claim 13, wherein the parallel sidewalls of the lower portion of the gate structure form angles with the slanted sidewalls of the upper portion of the gate structure, the angles being in a range of 181 degrees to 260 degrees.

17. The structure of claim 13, wherein a top surface of the gate mask is coplanar with top surfaces of the gate spacers.

18. The structure of claim 13, wherein the projecting portions of the gate spacers are separated by a first distance, the lower portion of the gate structure has a first width, and the first width is greater than the first distance.

19. The structure of claim 13, wherein the gate structure comprises an interior corner at an interface of the upper portion and the lower portion, sidewalls of the gate structure forming a rounded angle at the interior corner.

20. The structure of claim 13, wherein the gate structure comprises an interior corner at an interface of the upper portion and the lower portion, sidewalls of the gate structure forming a sharp angle at the interior corner.

* * * * *